(12) United States Patent
Liff et al.

(10) Patent No.: US 10,644,616 B2
(45) Date of Patent: May 5, 2020

(54) PIEZOELECTRIC PACKAGE-INTEGRATED MOTOR

(71) Applicant: Intel Corporation, Santa Clara, CA (US)

(72) Inventors: Shawna M. Liff, Scottsdale, AZ (US); Georgios C. Dogiamis, Chandler, AZ (US); Sasha N. Oster, Chandler, AZ (US); Feras Eid, Chandler, AZ (US); Adel A. Elsherbini, Chandler, AZ (US); Thomas L. Sounart, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 691 days.

(21) Appl. No.: 15/283,117

(22) Filed: Sep. 30, 2016

(65) Prior Publication Data

US 2018/0097458 A1 Apr. 5, 2018

(51) Int. Cl.
*H02N 2/02* (2006.01)
*H02N 2/10* (2006.01)
(Continued)

(52) U.S. Cl.
CPC ............ *H02N 2/023* (2013.01); *H01L 27/20* (2013.01); *H02N 2/025* (2013.01); *H02N 2/026* (2013.01); *H02N 2/101* (2013.01); *G01J 3/42* (2013.01)

(58) Field of Classification Search
CPC ........ H02N 2/023; H02N 2/025; H02N 2/026; H02N 2/101
See application file for complete search history.

(56) References Cited

U.S. PATENT DOCUMENTS

| | | | |
|---|---|---|---|
| 2008/0231143 A1* | 9/2008 | Chen | H02N 2/023 310/328 |
| 2013/0002411 A1* | 1/2013 | Henderson | H02N 2/005 340/407.1 |

(Continued)

FOREIGN PATENT DOCUMENTS

| | | |
|---|---|---|
| EP | 2677656 | 12/2013 |
| JP | 2013121213 | 6/2013 |
| WO | WO 2005089201 | 9/2005 |

OTHER PUBLICATIONS

International Search Report and Written Opinion for PCT/US2017/048947, dated Dec. 6, 2017, 14 pages.

(Continued)

*Primary Examiner* — J. San Martin
(74) *Attorney, Agent, or Firm* — Schwabe, Williamson & Wyatt, P.C.

(57) ABSTRACT

Embodiments of the invention include a self-propelled sensor system. In an embodiment, the self-propelled sensor system includes a piezoelectrically actuated motor that is integrated with a substrate. In an embodiment, the self-propelled sensor system may also include a sensor and an integrated circuit electrically coupled to the piezoelectrically actuated motor. Embodiments of the invention may also include self-propelled sensor systems that include plurality of piezoelectrically actuated motors. In an embodiment the piezoelectrically actuated motors may be one or more different types of motors including, but not limited to, stick and slip motors, inchworm stepping motors, standing acoustic wave motors, a plurality of piezoelectrically actuated cantilevers, and a piezoelectrically actuated diaphragm. Additional embodiments of the invention may include a plurality of self-propelled sensor systems that are communicatively coupled to form a sensor mesh.

25 Claims, 14 Drawing Sheets

(51) Int. Cl.
*H01L 27/20* (2006.01)
*G01J 3/42* (2006.01)

(56) References Cited

U.S. PATENT DOCUMENTS

| | | | |
|---|---|---|---|
| 2015/0042209 A1* | 2/2015 | Wischenwskiy | H02N 2/007 310/323.16 |
| 2015/0076965 A1 | 3/2015 | Culpi | |
| 2016/0233793 A1 | 8/2016 | Henderson et al. | |
| 2019/0033575 A1* | 1/2019 | Oster | G02B 26/0833 |
| 2019/0033576 A1* | 1/2019 | Oster | H01L 27/20 |

OTHER PUBLICATIONS

International Preliminary Report on Patentability for International Patent Application No. PCT/US2017/048947, dated Apr. 11, 2019, 11 pages.

* cited by examiner

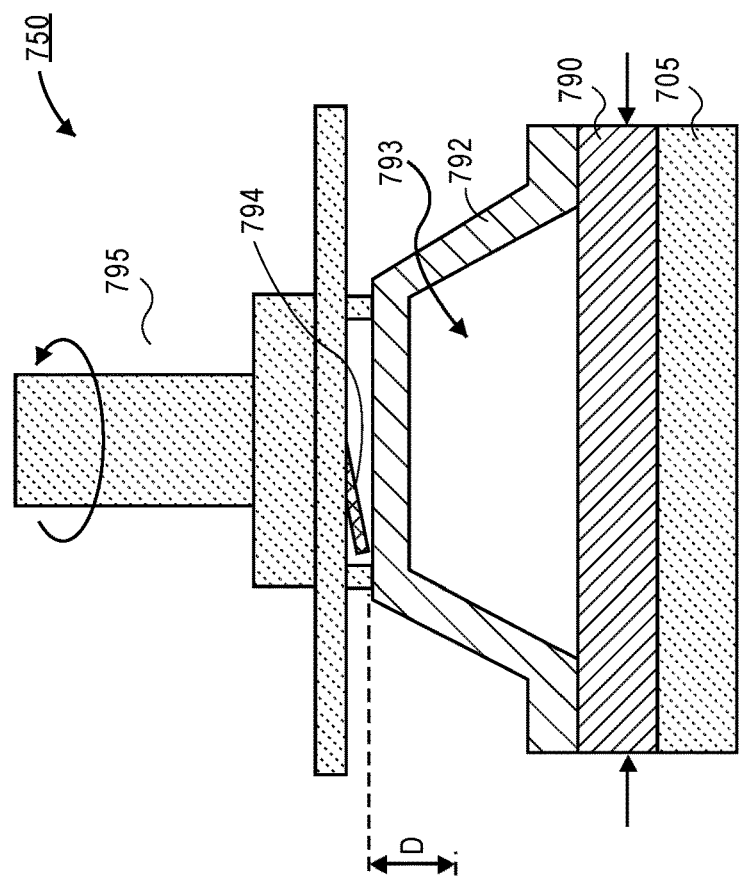
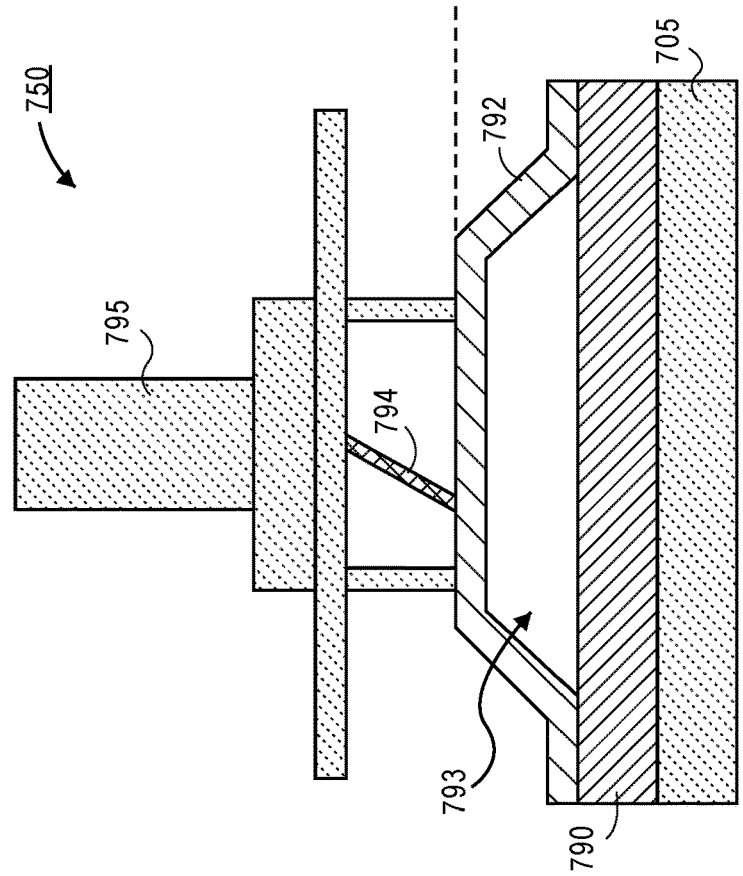

PIEZOELECTRIC PACKAGE-INTEGRATED MOTOR

FIELD OF THE INVENTION

Embodiments of the present invention relate generally package integrated piezoelectrically driven motors. In particular, embodiments of the present invention relate to package integrated piezoelectrically driven motors that provide self-propelled systems for sensing and/or mapping.

BACKGROUND OF THE INVENTION

Researchers are currently developing technologies, such as sensor nodes and terahertz networks to map rooms. The algorithms that are being developed include the assumption that these sensor nodes are stationary. Accordingly, only disturbances in the steady-state area are mapped. However, if prescribed motion of the sensor nodes were enabled and an area could be mapped relative to the plurality of moving sensors, then additional mapping intelligence could be provided. For example, the presence and/or movement of individuals in an area may be determined.

However, incorporating movement into a sensor node is challenging. There are currently robots and drones for numerous commercial applications such as package delivery, patient rehabilitation assistance, surveillance etc. In most cases these robots are large, complex systems with multiple joints and moving parts where numerous motors are connected through plugs, sockets, and cabling to one or more electronics control boxes. The large size and complexity of these systems limits their applicability to a network of devices moving and scanning an area.

Smaller motors that are surface mounted to a package may also be used. For example, various piezoelectrically actuated motors may be surface mounted to electronics packaging to provide movement. However, such piezoelectric motors are currently limited to being surface mounted due to the high temperature processing needed to form the piezoelectric material. High performance piezoelectric materials need to be annealed at temperatures (e.g., greater than 500° C.) in order to attain the proper crystal structure to provide the piezoelectric effect. Accordingly, the annealing process must be completed before mounting the piezoelectric motor to a microelectronics package since organic packaging substrates typically have much lower degradation temperatures (e.g., near or slightly above the 260° C. solder reflow temperatures). Furthermore, surface mounting the motors increases the overall size of the system, rendering it more difficult to deploy a plurality of them in each instance.

BRIEF DESCRIPTION OF THE DRAWINGS

FIG. 7A is a cross-sectional illustration a self-propelled system that includes a piezoelectrically driven motor that provides rotational motion with a piezoelectrically driven diaphragm, according to an embodiment of the invention.

FIG. 7B is a cross-sectional illustration the self-propelled system in FIG. 7A after the diaphragm is extended to actuate a fin that produces rotational motion, according to an embodiment of the invention.

DETAILED DESCRIPTION OF THE INVENTION

Described herein are systems that include package integrated piezoelectrically driven motors that provide self-propelled systems for sensing and/or mapping and methods of forming such systems. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations. Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
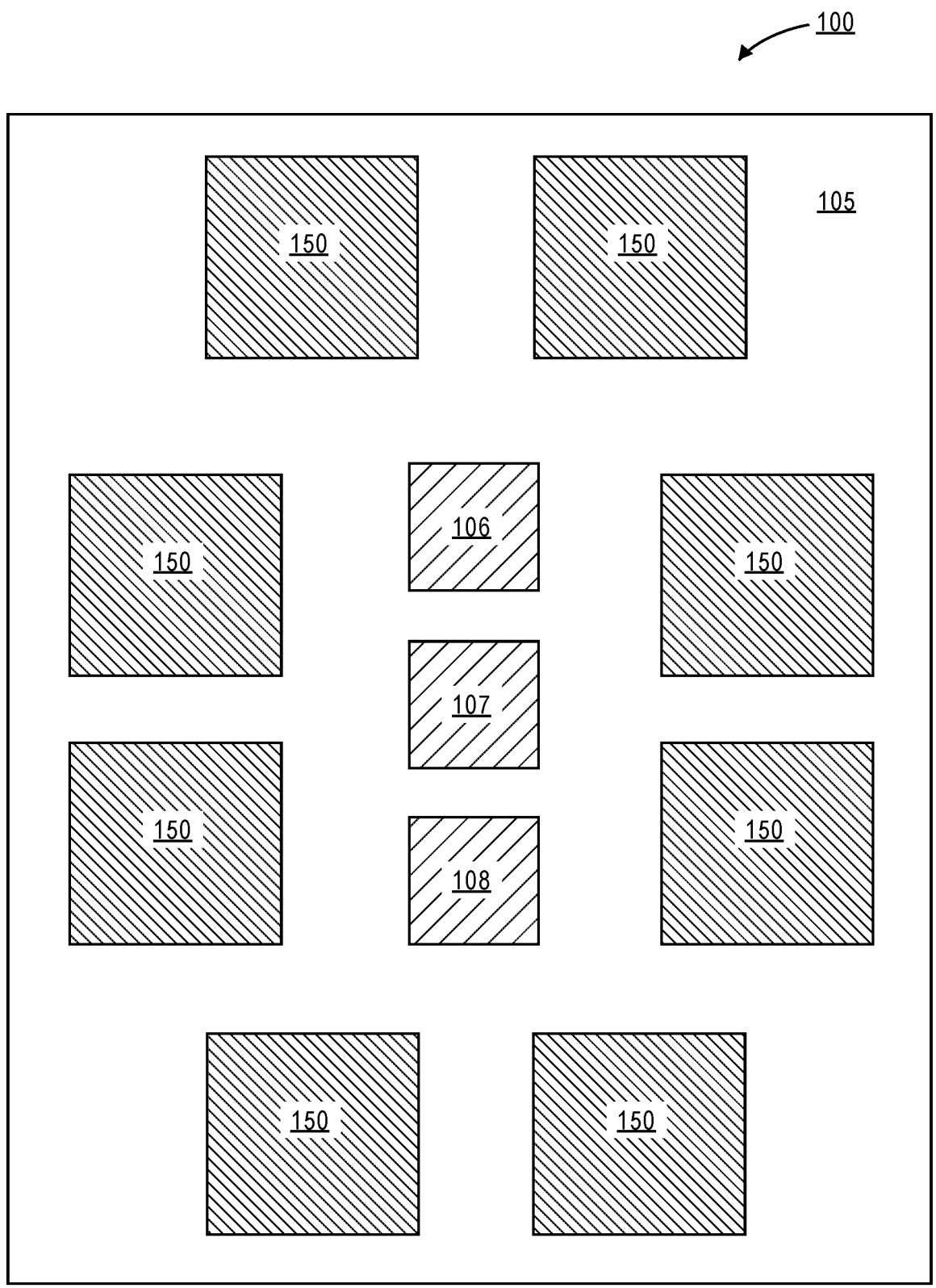
FIG. 1 is a schematic block diagram of a self-propelled system that includes one or more piezoelectrically driven motors that are integrated into/onto the microelectronics package, according to an embodiment of the invention.

Embodiments of the invention include self-propelled systems that are able to provide mapping and sensing functionalities. A schematic illustration of such a system is illustrated in FIG. 1. According to an embodiment, a self-propelled system 100 may include one or more piezoelectrically driven motors 150 formed into and/or on a substrate 105. Unlike the surface mounted motors described above, motors 150 according to embodiments of the invention include piezoelectric actuators that are fabricated directly into/onto the microelectronics packaging. Embodiments of the invention include motors 150 that are formed with a high performance piezoelectric material. For example, the high performance piezoelectric material may be lead zirconate titanate (PZT), potassium sodium niobate (KNN), zinc oxide (ZnO), or combinations thereof. High performance piezoelectric materials such as these typically require a high temperature anneal (e.g., greater than 500° C.) in order to attain the proper crystal structure to provide the piezoelectric effect. As such, currently available piezoelectric actuators require a substrate that is capable of withstanding high temperatures (e.g., silicon). Low melting temperature substrates described herein, such as organic substrates, typically cannot withstand temperatures above approximately 260° C. due to degradation. However, embodiments of the present invention allow for a piezoelectric material to be formed at much lower temperatures. For example, instead of a high temperature anneal, embodiments include depositing the piezoelectric material in an amorphous phase and then using a pulsed laser to crystalize the piezoelectric material. For example, the piezoelectric material may be deposited with a sputtering process, an ink jetting process, or the like. According to an embodiment, the pulsed laser annealing process may use an excimer laser with an energy density between approximately 10-100 mJ/cm2 and a pulsewidth between approximately 10-50 nanoseconds. Utilizing such an annealing process allows for the high performance piezoelectric material to be formed without damaging the substrate 105 on which the motor 150 is formed. Accordingly, the system 100 is able to move similar to the surface mounted systems described above, without the need for surface mounting piezoelectric components. Eliminating the need to surface mount additional components allows for further form factor reduction. While not limited to any particular design or type of motor, some examples of piezoelectrically driven motors are included in greater detail below with respect to FIGS. 2A-7B.

According to an embodiment, the system 100 may also include one or more integrated circuits 106 (e.g., processors, memory, etc.) for controlling the piezoelectrically driven motors 150. The one or more integrated circuits 106 may be electrically coupled to the motors 150 by conductive traces/vias (not shown) formed in and/or on the substrate 105. Embodiments of the invention may also include one or more sensors 107 formed on and/or in the substrate 105. For example, the sensors 107 may include sensors for detecting temperature, the presence of gasses in the atmosphere, or the like. Additionally, the sensors 107 may include terahertz imaging devices. For example, terahertz imaging devices may be utilized to provide mapping functionality or to determine the presence of objects and/or persons in the area. While terahertz imaging may be particularly beneficial, it is to be appreciated that the sensors may also include other imaging technologies (e.g., video, camera, sonar, x-ray, etc.).

In some embodiments of the invention, the system 100 may include one or more processors 106 that provide control of the system 100 without needing to communicate with other devices. For example, the integrated circuitry 106 may provide instructions for controlling the movement of the system 100, recording and saving data produced by the sensors 107, and/or any other functionality enabled by the system 100. According to an additional embodiment, the system 100 may include a wireless communication module 108 to allow for data and/or instructions to be delivered and/or received from a remote location. For example, the wireless communication module may include any of a number of wireless standards or protocols (e.g., Wi-Fi, Bluetooth, etc.). Such embodiments may allow for the system 100 to be deployed in a location where it would not be desirable to deploy a human and may still allow for real-time (or near real-time) monitoring of an area. Additional embodiments may also include a plurality of systems 100 that communicate with each other via their communication modules 108. As such, a swarm of systems 100 may be deployed in an area to rapidly map and/or monitor a given area.

In one embodiment, such a system 100 or a plurality of systems 100 may be used when a catastrophic event (e.g., a fire, an explosion, a hostage situation, etc.) has taken place and rescue personnel need the ability to assess whether there are any people alive and/or if there are any remaining hazards that would limit the effectiveness of rescue personnel entering the area. For example, a home may have caught on fire and rescue personnel are unable to enter an upstairs room without risking their life due to loss of the home's structural integrity. Instead of risking the life of a rescuer, the rescue personnel can throw one or more self-propelled microelectronic packaged systems 100 that can scatter and travel through the home, detecting life, mapping the physical space, and assessing further threats and relay this information back to rescue personnel.

There are multiple methods through which piezoelectric motors may be integrated into the organic packages in both locking and motive configurations. A selection of representative motors and integration schemes to enable various drive methodologies described below are provided as examples and embodiments are not limited to only these particular types of motors. For example, embodiments of the invention may include systems 100 with any piezoelectrically driven motors that are fabricated in conjunction with the fabrication of the microelectronic package. Additionally, it is to be appreciated that package integrated piezoelectric motors, such as those described herein, may be used in combination with any other integration approaches (e.g., surface mounting piezoelectric elements, adhesive or mechanical coupling, etc.).

Figure 2A:
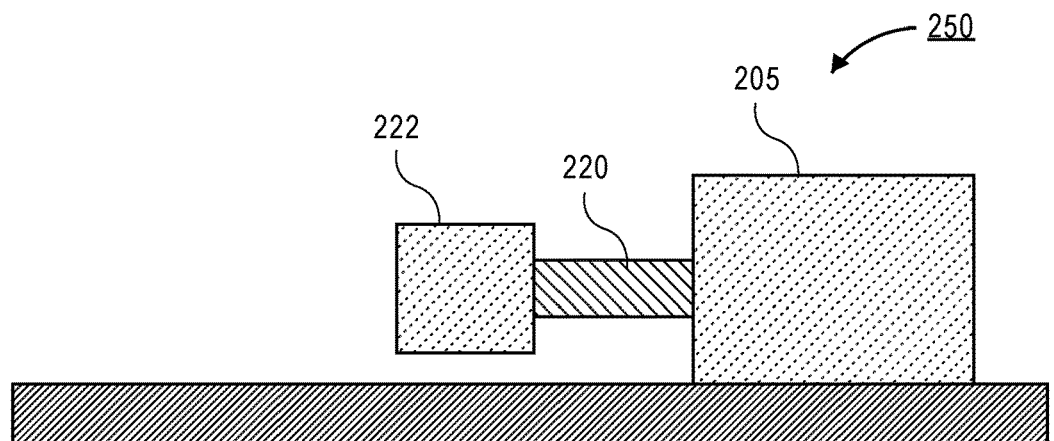
FIG. 2A is a cross-sectional illustration of a portion of a self-propelled system that includes a piezoelectrically driven motor that provides motion with a stick and slip process, according to an embodiment of the invention.
Figure 2B:
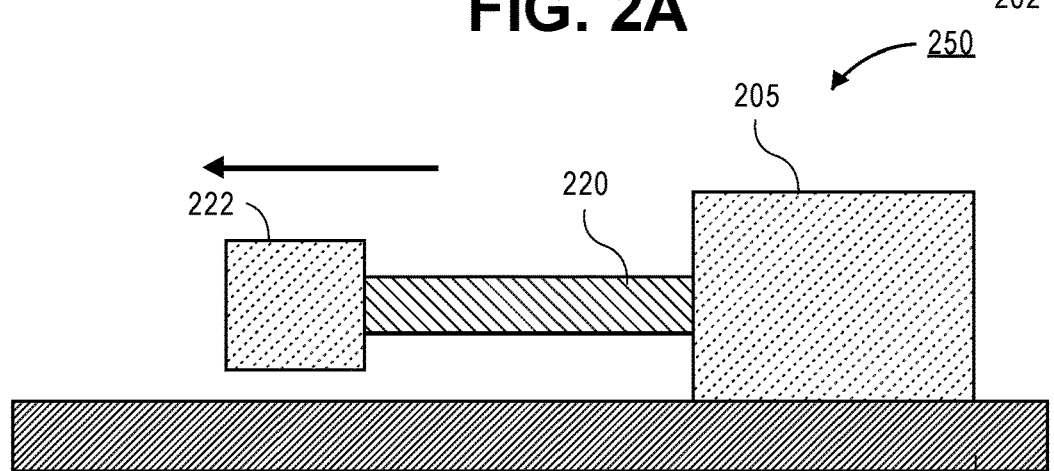
FIG. 2B is a cross-sectional illustration of the piezoelectrically driven motor in FIG. 2A after the piezoelectric drive arm is extended, according to an embodiment of the invention.
Figure 2C:
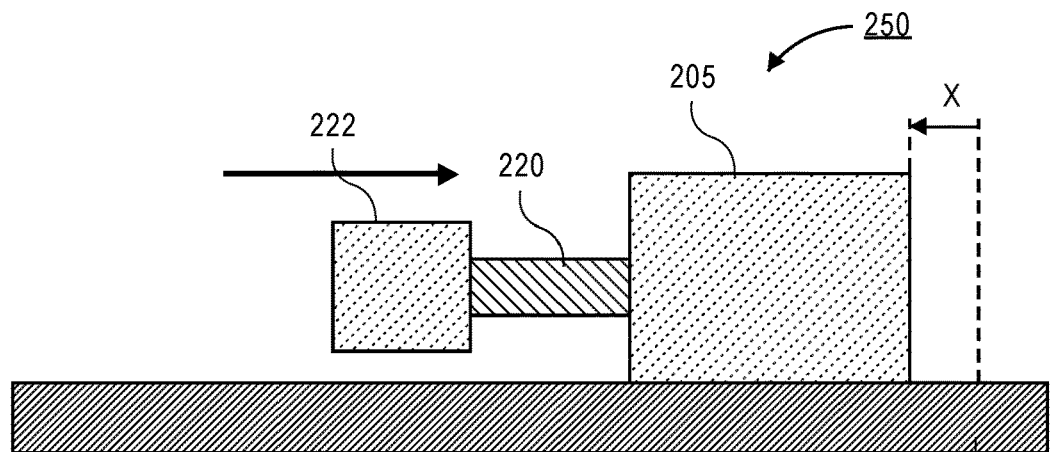
FIG. 2C is a cross-sectional illustration of the piezoelectrically driven motor in FIG. 2B after the piezoelectric drive arm is retracted rapidly and the system is displaced, according to an embodiment of the invention.

Referring now to FIGS. 2A-2C, cross-sectional illustrations of a package integrated piezoelectric motor 250 that provides motion with a stick and slip process is shown, according to an embodiment of the invention. According to an embodiment, the motor 250 may include a piezoelectric drive arm 220 that extends out from a sidewall surface of the substrate 205. In an embodiment, the piezoelectric drive arm 220 may be a high performance piezoelectric material that is formed with a deposition and laser annealing process, such as the one described above. For example, the piezoelectric drive arm 220 may be deposited on a sacrificial material that is subsequently annealed.

In an embodiment, a mass 222 may be coupled to an end of the piezoelectric drive arm 220 opposite from the end coupled to the substrate 205. According to an embodiment, the mass 222 may be any material that provides the needed momentum to overcome a friction force between the substrate 205 and a surface 202 to initiate slippage (as will be described below). For example, the mass 222 may be the same material as the substrate 205, or it may be a more dense material, such as a metallic material (e.g., copper). Additionally, while the piezoelectric drive arm 220 is shown connecting to a sidewall surface of the mass 222, it is to be appreciated that the mass 222 may be supported from below by an end portion of the piezoelectric drive arm 220, or attached to the piezoelectric drive arm 220 in any other configuration.

According to an embodiment, the piezoelectric drive arm 220 may be actuated by electrodes (not shown) that provide a voltage differential across the piezoelectric material. In response to the voltage differential, the piezoelectric drive arm 220 may extend outwards, as illustrated by the arrow in FIG. 2B. In an embodiment, the piezoelectric drive arm 220 may be extended in a relatively slow and controlled manner. For example, the voltage differential applied to the piezoelectric drive arm 220 may be increased gradually. Due to the slow extension of the piezoelectric drive arm 220, there is substantially no global motion of the substrate 205.

Referring now to FIG. 2C, global motion in the substrate 205 is provided by rapidly retracting the piezoelectric drive arm 220, as indicated by the arrow. In order to overcome the force of friction, the piezoelectric drive arm 220 may be retracted at a speed greater than the speed at which the piezoelectric drive arm 220 was extended. For example, instead of gradually reducing the voltage differential applied to the piezoelectric drive arm 220, the voltage differential may be switched off. The rapid retraction of the piezoelectric drive arm 220 also retracts the mass 222, thereby generating a momentum that is greater than the friction force between the substrate 205 and the surface 202 on which the motor 250 is supported. As such, the substrate 205 may be displaced a distance X.

While a single piezoelectric drive arm 220 is illustrated in FIGS. 2A-2C, it is to be appreciated that a plurality of piezoelectric drive arms 220 and masses 222 may be used to provide an increased momentum and/or to provide motors 250 that are oriented to provide movement in different directions. For example, on a substantially rectangular substrate, there may be one or more stick and slip piezoelectrically driven motors 250 along each sidewall of the substrate. Furthermore, it is to be appreciated that the motors 250 do not need to extend out from an outer sidewall of the substrate 205. For example, a stick and slip piezoelectrically driven motor 250 may be embedded within a cavity formed in the substrate 205. In such an embodiment, the piezoelectric drive arm 220 may extend out from a sidewall of the cavity.

Figure 3A:
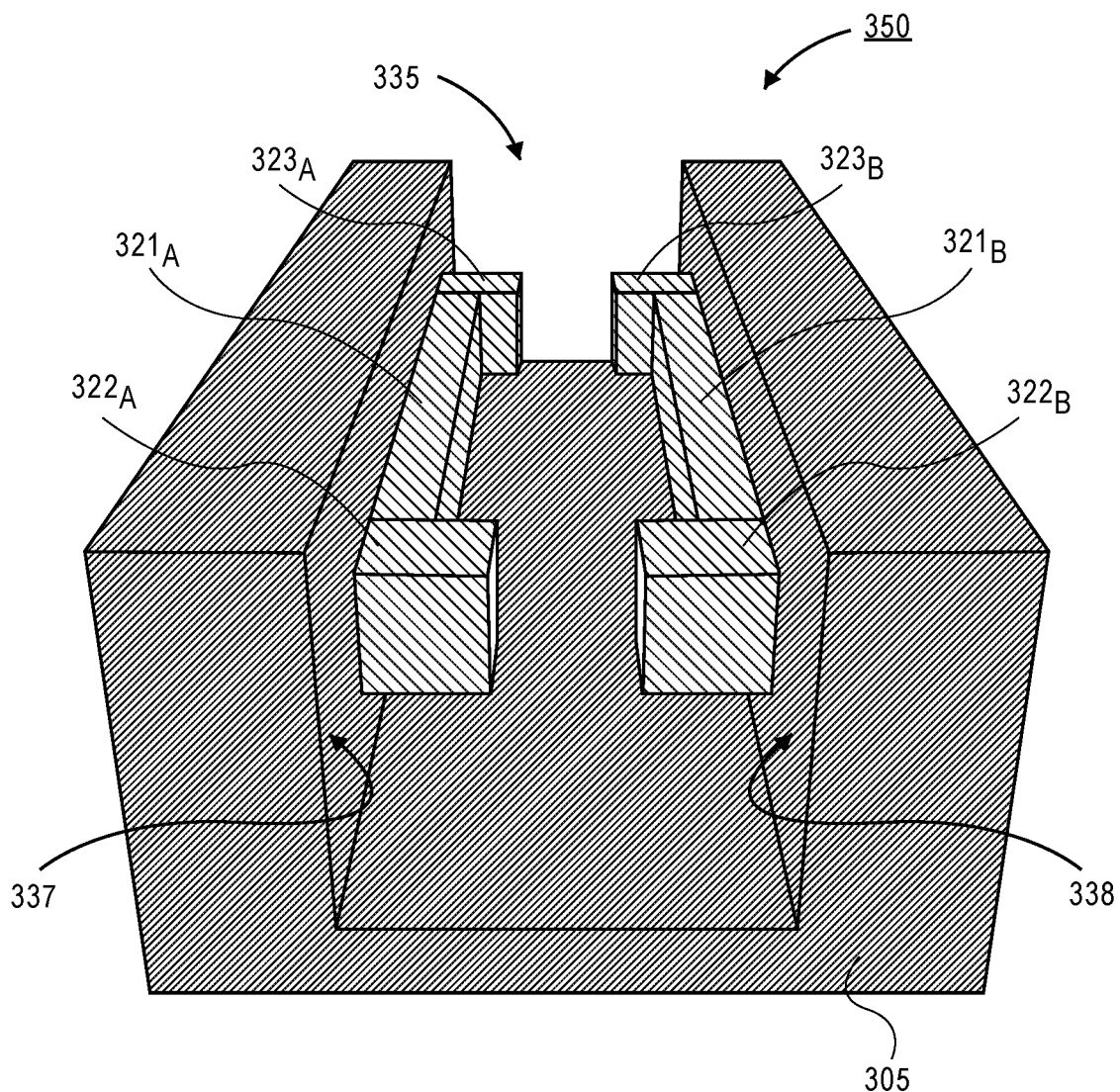
FIG. 3A is a three-dimensional illustration of a portion of a self-propelled system that includes a piezoelectrically driven motor that provides motion with an inchworm stepping process, according to an embodiment of the invention.

Referring now to FIGS. 3A-3I, an example of a piezoelectrically driven inchworm stepping motor is shown, according to an embodiment of the invention. In FIG. 3A, a three-dimensional illustration of the inchworm stepping motor 350 is shown, according to an embodiment of the invention. The piezoelectric inchworm stepping motor 350 includes opposing pairs of piezoelectric clamping and extending arms formed in a channel 335 within the substrate 305. In the illustrated embodiment, first piezoelectric clamping arms 323A, 323B are formed proximate to one end of the piezoelectric extension arms 321A, 321B, and second piezoelectric clamping arms 322A, 322B are formed proximate to an opposite end of the piezoelectric extension arms 321A, 321B. According to an embodiment, each of the clamping and extending arms may be distinct piezoelectric regions, or each pair of clamping and extending arms may be a single piezoelectric material layer. In an embodiment, the piezoelectric arms 321, 322, 323 may be a high performance piezoelectric material that is formed with a deposition and laser annealing process, such as the one described above.

In the illustrated embodiment, each pair of clamping and extending arms 321, 322, 323, are shown as being formed in contact with sidewalls 337 or 338 of the channel 335. However, it is to be appreciated that each pair of clamping and extending arms 321, 322, 323 may be attached to the sidewalls 337 or 338 by a spacer (not shown) that allows for free movement of the piezoelectric components. Additionally, it is to be appreciated that electrodes (not shown) to provide a voltage differential across each clamping or extending arm are also formed as part of the motor 350, and are omitted to not unnecessarily obscure the actuation mechanism of the motor 350.

In order to provide motion, the actuation of the first piezoelectric clamping arms $323_A$, $323_B$, the piezoelectric extension arms 321$_A$, 321$_B$, and the second piezoelectric clamping arms 322$_A$, 322$_B$, are coordinated to pinch a track (not shown in FIG. 3A) that runs along the channel 335. FIGS. 3B-3I, provide plan view illustrations of a process for moving the substrate 305 along a track with the motor 350, according to an embodiment of the invention.

Figure 3B:
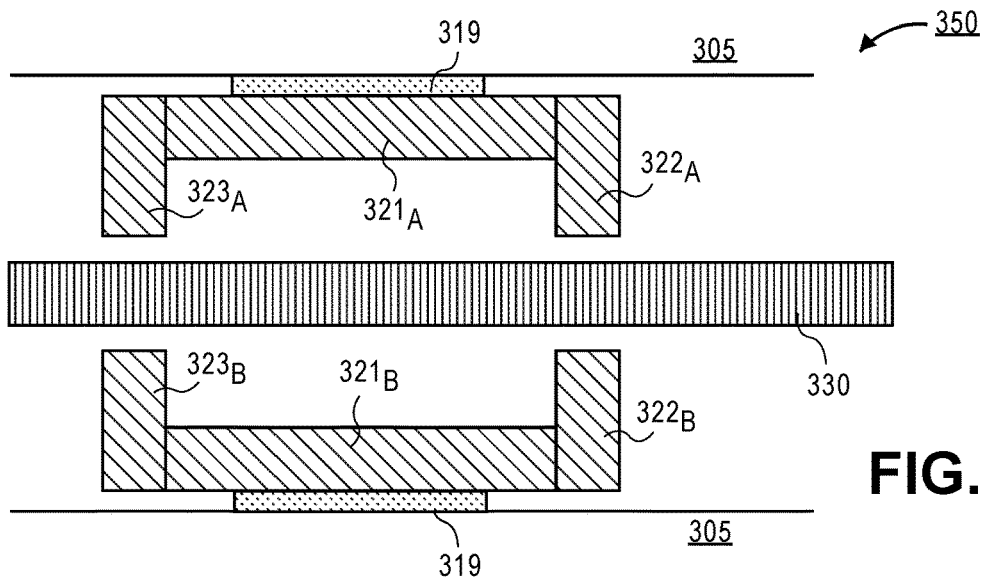
FIG. 3B is a cross-sectional schematic of the system in FIG. 3A in a relaxed state, according to an embodiment of the invention.

Referring now to FIG. 3B, the track 330 is shown extending between the pairs of first piezoelectric clamping arms 323$_A$, 323$_B$, the piezoelectric extension arms 321$_A$, 321$_B$, and the second piezoelectric clamping arms 322$_A$, 322$_B$. In FIG. 3B, the motor 350 is in a relaxed position (i.e., none of the piezoelectric arms are actuated and in contact with the track 330). Additionally, FIG. 3B provides an example of a spacer 319 that may be formed between the sidewalls of the substrate 305 and the piezoelectric arms 321. The spacer 319 may be any suitable material. In one embodiment, the spacer 319 may be the same material as the substrate. Additionally, the spacer 319 may include conductive traces formed through it to provide an electrical connection to electrodes (not shown) that actuate one or more of the piezoelectric arms.

Figure 3C:
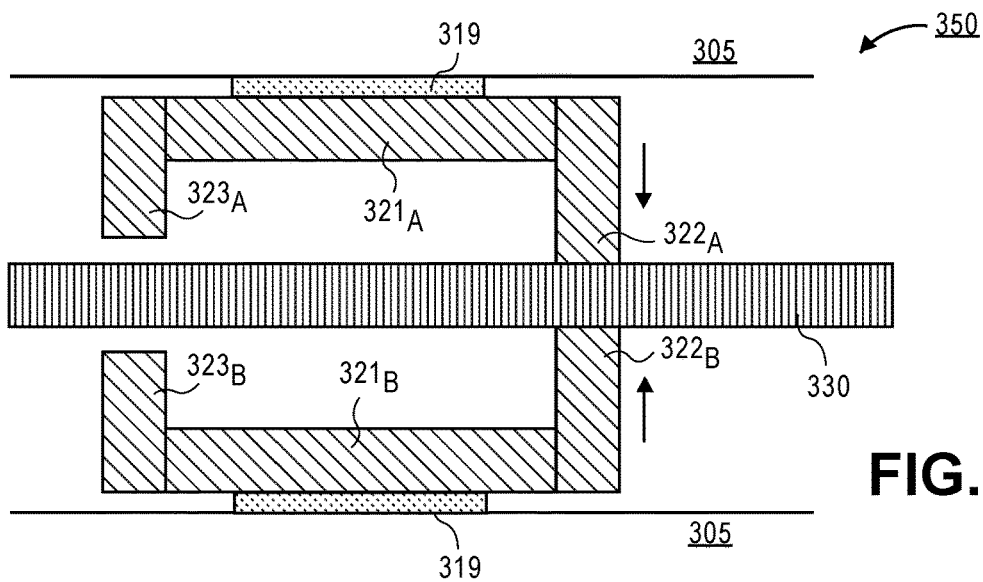
FIG. 3C is a cross-sectional schematic of the system in FIG. 3A in an initiated state with the first clamping arms of the piezoelectric motor extended to secure a track, according to an embodiment of the invention.
Figure 3D:
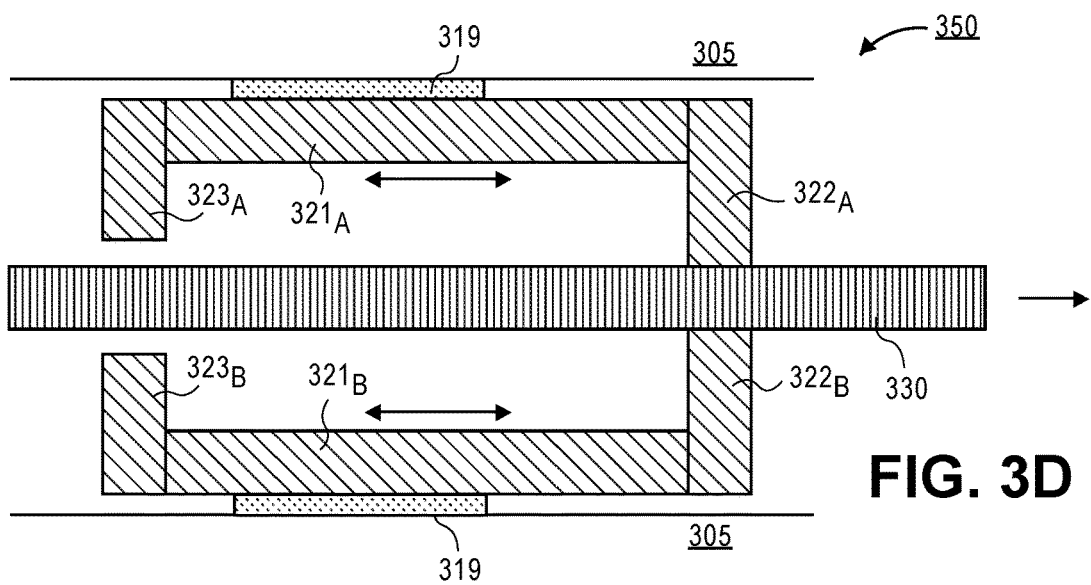
FIG. 3D is a cross-sectional schematic of the system in FIG. 3C after the extension arms of the piezoelectric motor are extended, according to an embodiment of the invention.

Referring now to FIG. 3C, the second piezoelectric clamping arms 322$_A$, 322$_B$ are extended, as illustrated by the arrows. In an embodiment, the second clamping arms 322 are extended until they contact and secure the track 330. Once the track 330 is secured by the second clamping arms 322, the piezoelectric extension arms 321$_A$, 321$_B$ are extended, as illustrated by the double arrows in FIG. 3D. Since the track 330 is secured by the clamping arms 322, the extension of the piezoelectric extension arms 321$_A$, 321$_B$, causes the track to be moved as indicated by the arrow to the right of the track 330. However, it is to be appreciated that if the track 330 was restrained so that it could not move, then the substrate 305 would be displaced relative to the stationary track in a direction opposite the arrow in FIG. 3D.

Figure 3E:
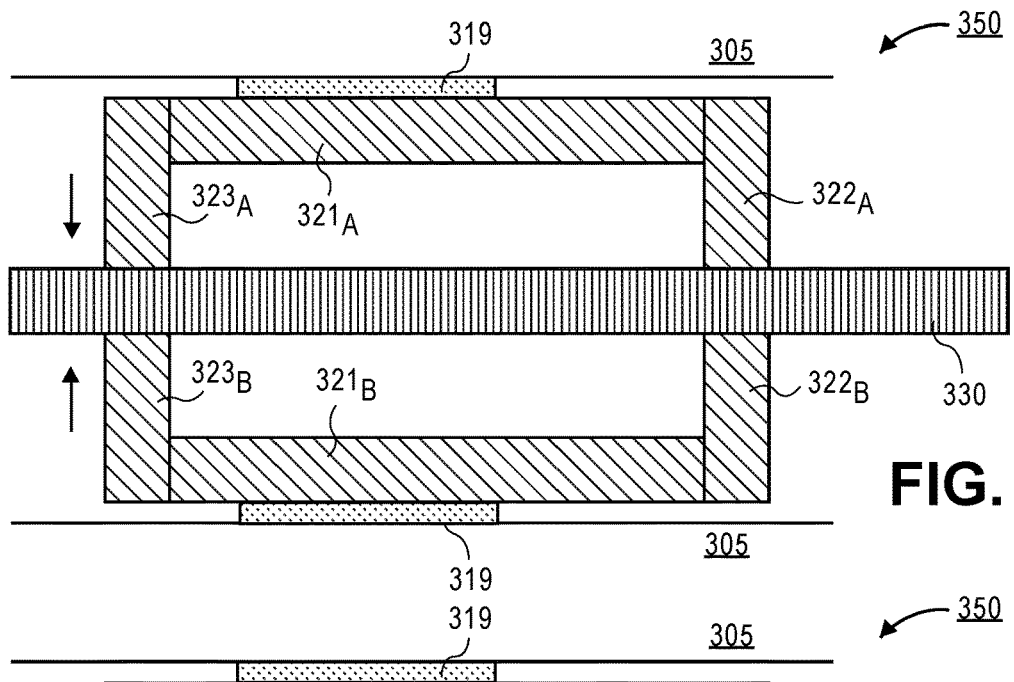
FIG. 3E is a cross-sectional schematic of the system in FIG. 3D after the second clamping arms of the piezoelectric motor are extended to secure the track, according to an embodiment of the invention.
Figure 3F:
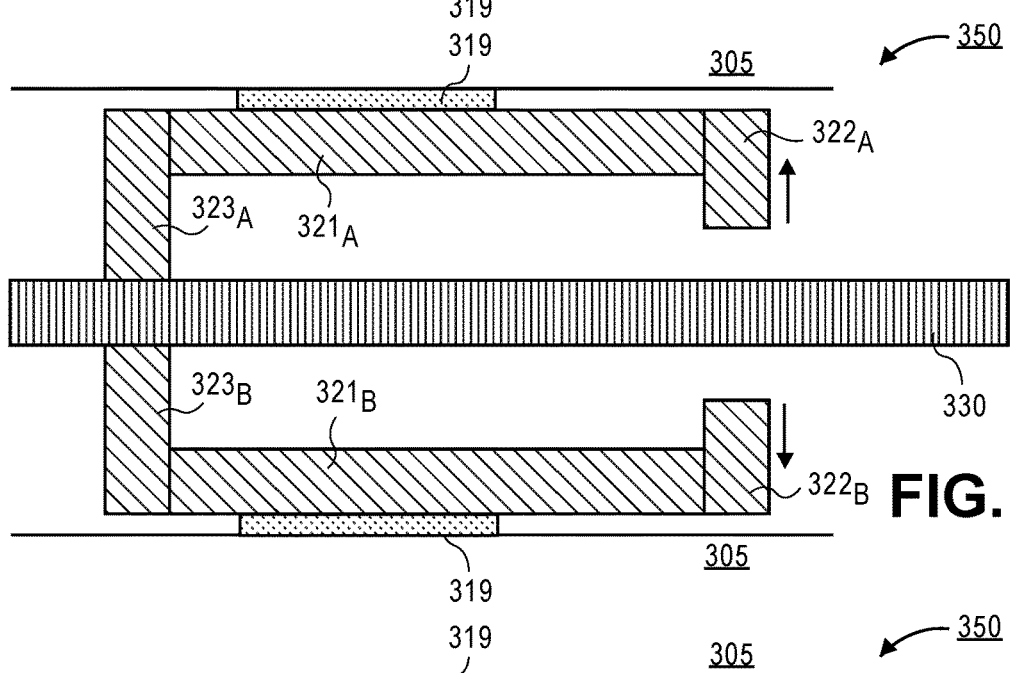
FIG. 3F is a cross-sectional schematic of the system in FIG. 3E after the first clamping arms of the piezoelectric motor are retracted to release the track, according to an embodiment of the invention.

Referring now to FIG. 3E, the first piezoelectric clamping arms 323$_A$, 323$_B$, are extended towards the track 330, as indicated by the arrows. Since the first clamping arms 323$_A$, 323$_B$ secure the track 330 while the extension arms 321$_A$, 321$_B$ are still extended, the movement of the substrate 305 relative to the track 330 is preserved when the second clamping arms 322$_A$, 322$_B$ are retracted away from the track 330, as illustrated by the arrows in FIG. 3F.

Figure 3G:
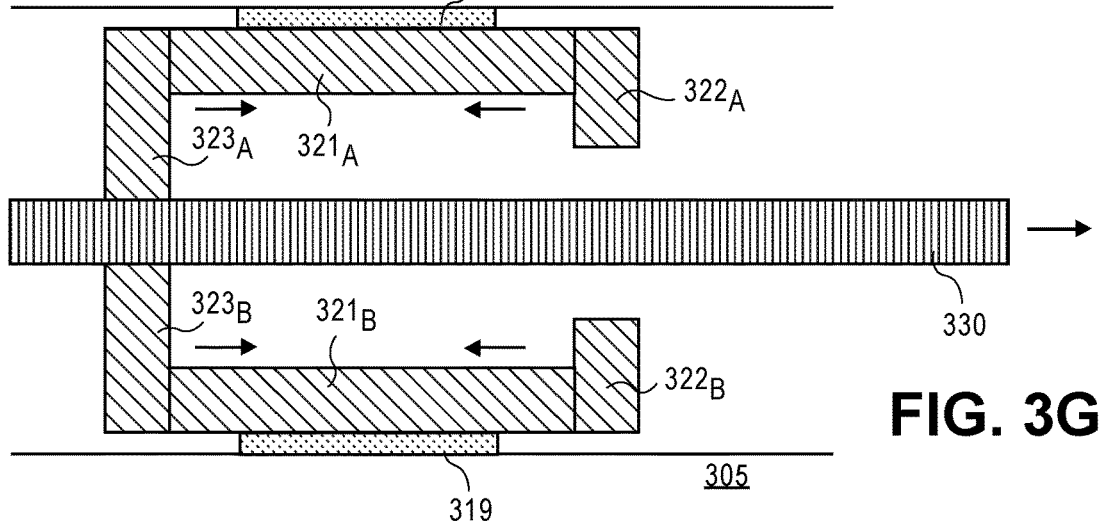
FIG. 3G is a cross-sectional schematic of the system in FIG. 3F after the extension arms of the piezoelectric motor are retracted, according to an embodiment of the invention.
Figure 3H:
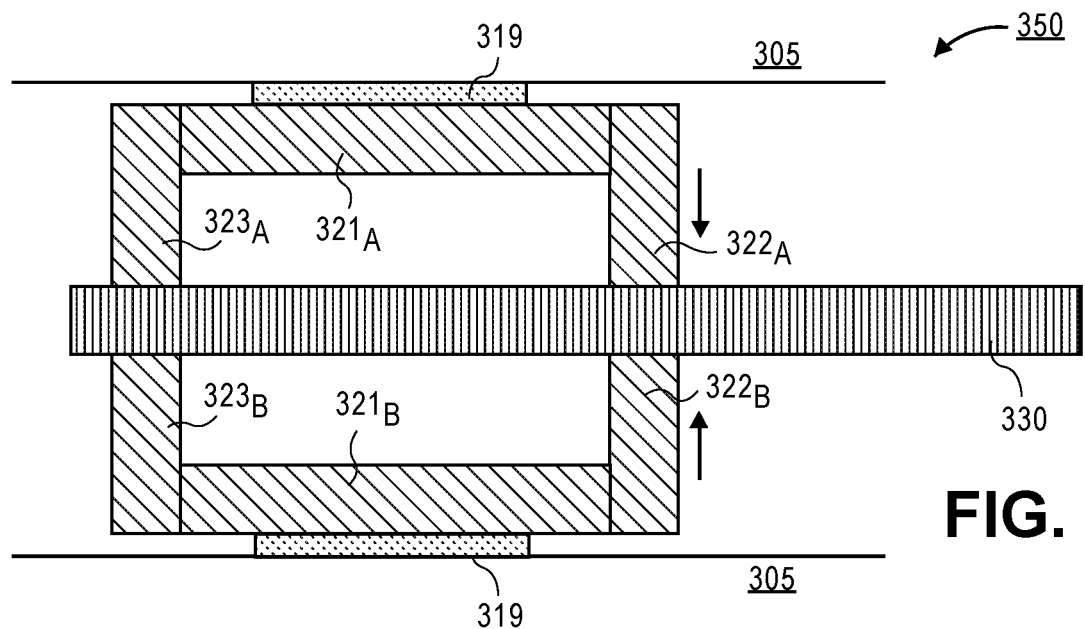
FIG. 3H is a cross-sectional schematic of the system in FIG. 3G after the first clamping arms of the piezoelectric motor are extended to secure the track, according to an embodiment of the invention.
Figure 3I:
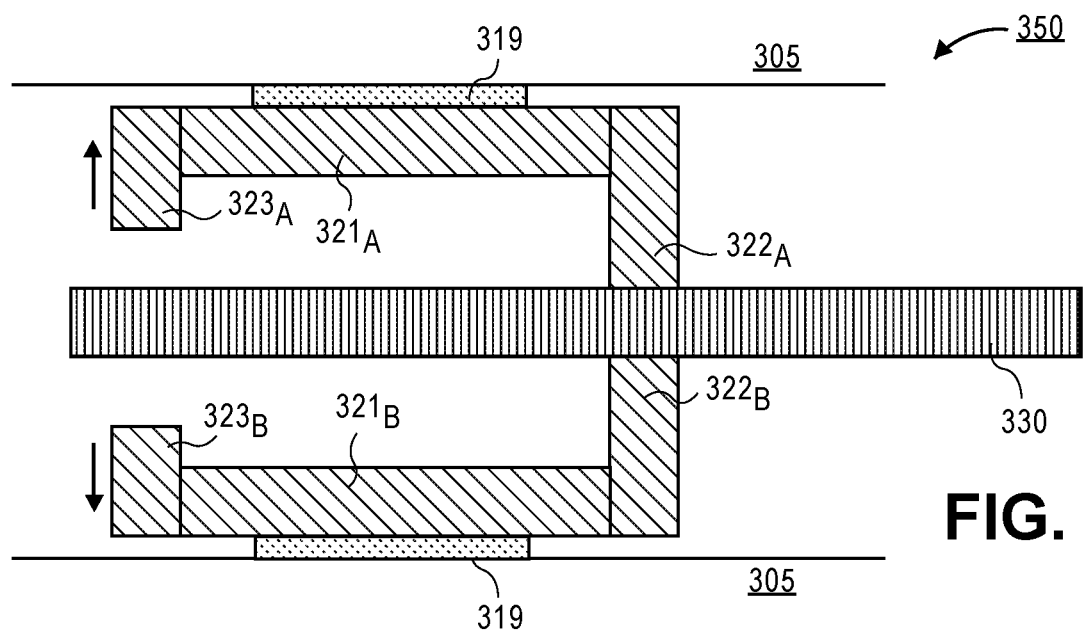
FIG. 3I is a cross-sectional schematic of the system in FIG. 3H after the second clamping arms of the piezoelectric motor are retracted to release the track, according to an embodiment of the invention.

Referring now to FIG. 3G, the piezoelectric extension arms 321$_A$, 321$_B$ are retracted, as indicated by the arrows. Accordingly, there is relative motion between the substrate 305 and the track 330, as shown by the arrow at the end of the track 330. Referring now to FIG. 3H, the second clamping arms 322$_A$, 322$_B$ are extended back towards the track 330 to secure the track 330 again. Finally, the first clamping arms 323$_A$, 323$_B$ may be retracted to release the track 330, as illustrated in FIG. 3I. Accordingly, the process has looped back to the same state illustrated in FIG. 3C, and may be repeated any number of times to provide the desired distance of movement.

Figure 4A:
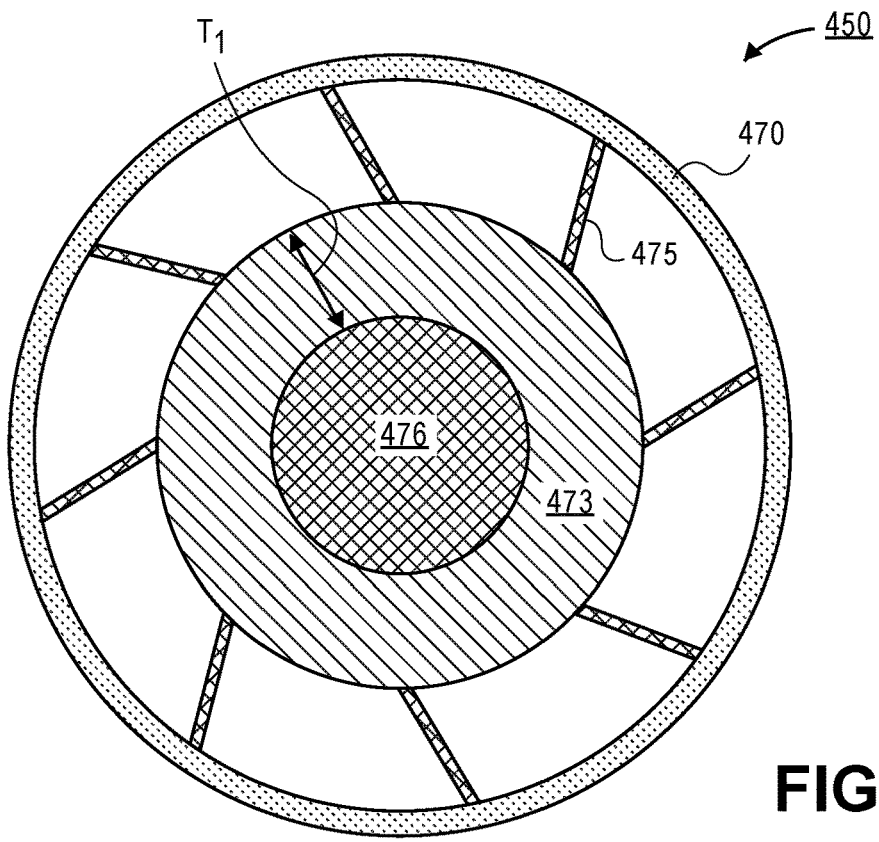
FIG. 4A is a plan view of a portion of a self-propelled system that includes a piezoelectrically driven motor that provides motion with a standing acoustic wave, according to an embodiment of the invention.

According to an additional embodiment, the piezoelectrically driven motor may be driven by a surface acoustic wave. Such an embodiment is described with respect to FIGS. 4A-4C. Referring now to FIG. 4A, a plan view of the motor 450 is shown, according to an embodiment of the invention. The surface acoustic wave motor 450 may include a spindle 476 that is formed in the center of the motor 450. In an embodiment, a piezoelectric ring 473 is formed around the surface of the spindle 476. According to an embodiment, the piezoelectric ring 473 is coupled to a plurality of fins 475 that are spaced radially around the outer perimeter of the piezoelectric ring 473. According to an embodiment, the fins 475 extend out from the piezoelectric ring 473 and contact an outer ring 470. In order to allow for the outer ring 473 to rotate, the fins 475 contact the outer ring 470, but are not permanently attached to the outer ring 470.

Figure 4B:
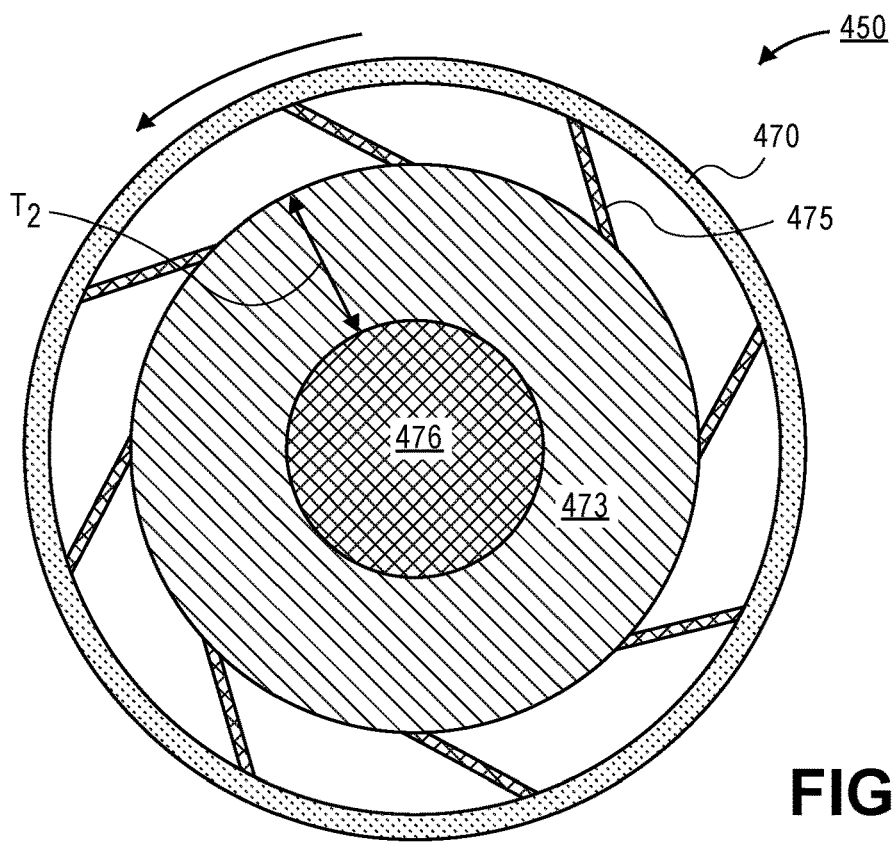
FIG. 4B is a plan view of the portion of the self-propelled system shown in FIG. 4A when the piezoelectric ring is expanded to induce rotational motion of an outer ring, according to an embodiment of the invention.

In order to induce motion, the piezoelectric ring 473 is resonated with a radial standing wave. As shown in FIG. 4B, the expansion of the piezoelectric ring 473 causes the thickness of the piezoelectric ring 473 to expand to a thickness $T_2$ that is greater than the thickness $T_1$ in the unexpanded piezoelectric ring 473 shown in FIG. 4A. As such, the fins 475 are deflected and cause the ring 470 to rotate, as indicated by the arrow. When the piezoelectric ring 473 retracts to its original thickness $T_1$, the fins 475 slide back along the inner surface of the outer ring 470 since they are not permanently attached. Accordingly, the outer ring 470 is rotated incrementally with each expansion/retraction cycle of the piezoelectric ring 473.

Figure 4C:
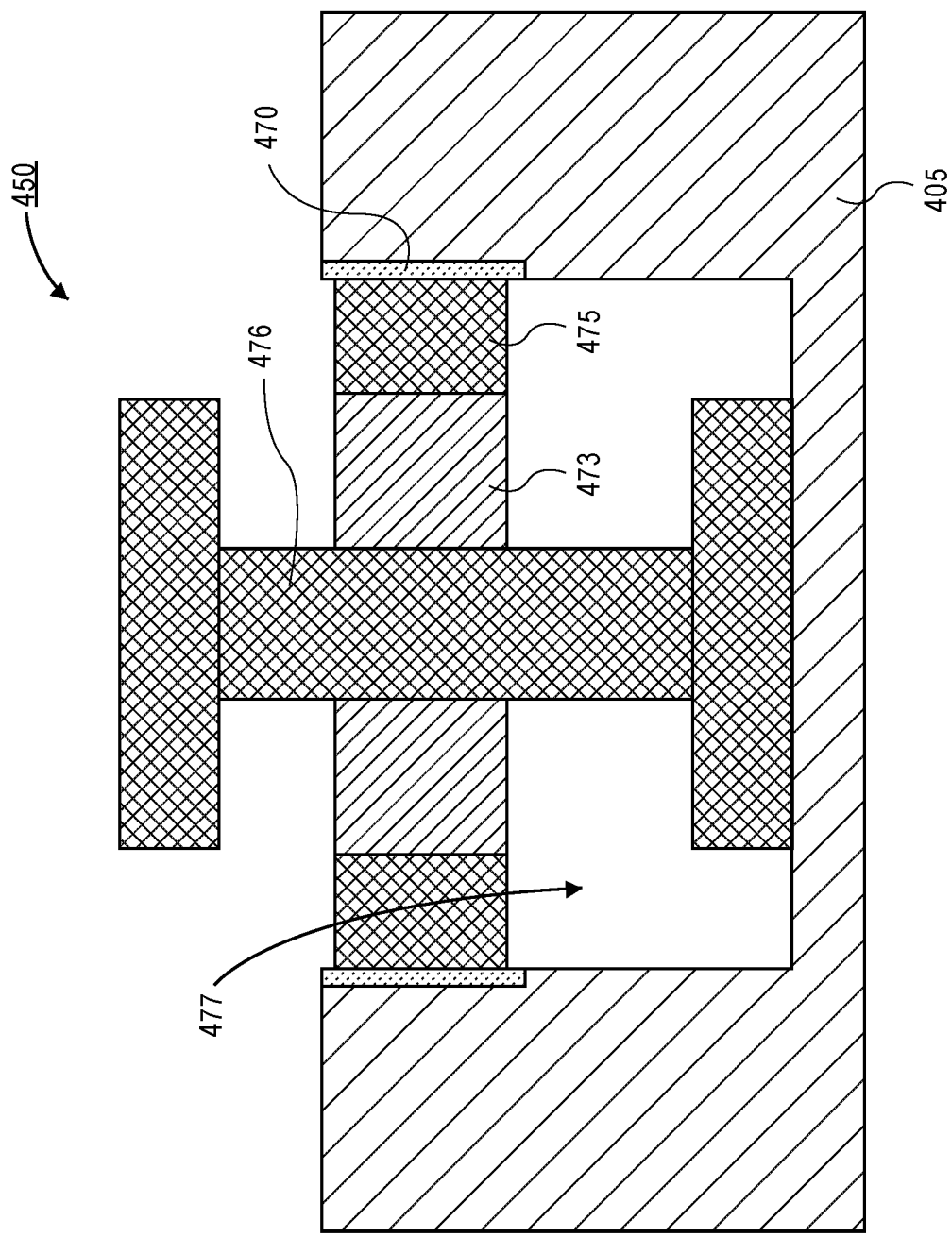
FIG. 4C is a cross-sectional illustration of the portion of the self-propelled system in FIG. 4A, according to an embodiment of the invention.

Referring now to FIG. 4C, a cross-sectional illustration of the surface acoustic wave motor 450 integrated into a package substrate 405 is shown, according to an embodiment of the invention. In an embodiment, the spindle 476 may be formed in a cavity 477 in the substrate 405. In the illustrated embodiment, the spindle 476 has an I-shaped cross-section, though embodiments are not limited to such configurations. For example, the spindle 476 may have a substantially rectangular cross-section. Additionally, the outer ring 470 is inlayed into the substrate 470, but other configurations may also be used depending on the needs of the device. The piezoelectric ring 473 and the fins 475 may be formed on a surface of the substrate 405 that is subsequently removed. Alternatively, a sacrificial material (not shown) may be filled into the cavity and the piezoelectric ring 473 and the fins 475 may be formed on the surface of the sacrificial material, with the sacrificial material subsequently being removed.

According to an embodiment, the spindle 476, the fins 475, and the outer ring 470 may be formed with standard multi-layer printed circuit board (PCB) buildup processes, and the piezoelectric ring 473 may be formed with a deposition and laser annealing process similar to the process described above in conjunction with cavity in package processing. For example, the fins 475 may be formed as copper traces that disconnect at the outer ring 470 to enable spinning, and the spindle 476 may be formed as copper pads and vias that are subsequently exposed when the cavity is formed. In an embodiment, standard package processing may also include the formation of surface finishes (e.g., carbon) on the fins 475 and/or outer ring 470 to provide smoother operation of the motor 450 in order to limit jamming. In an additional embodiment, the motor 450 may be discretely fabricated and mounted into the cavity with a press-fitting operation.

Additional embodiments of the invention may also include a piezoelectrically driven motor that includes a plurality of cantilevers that extend out from a substrate. A schematic illustration of the process used to extend/retract and bend the cantilevers is shown and described with respect to FIGS. 5A-5D. A more detailed illustration of a process that may be used to fabricate the plurality of the cantilevers is shown and described with respect to FIGS. 6A-6D.

Figure 5A:
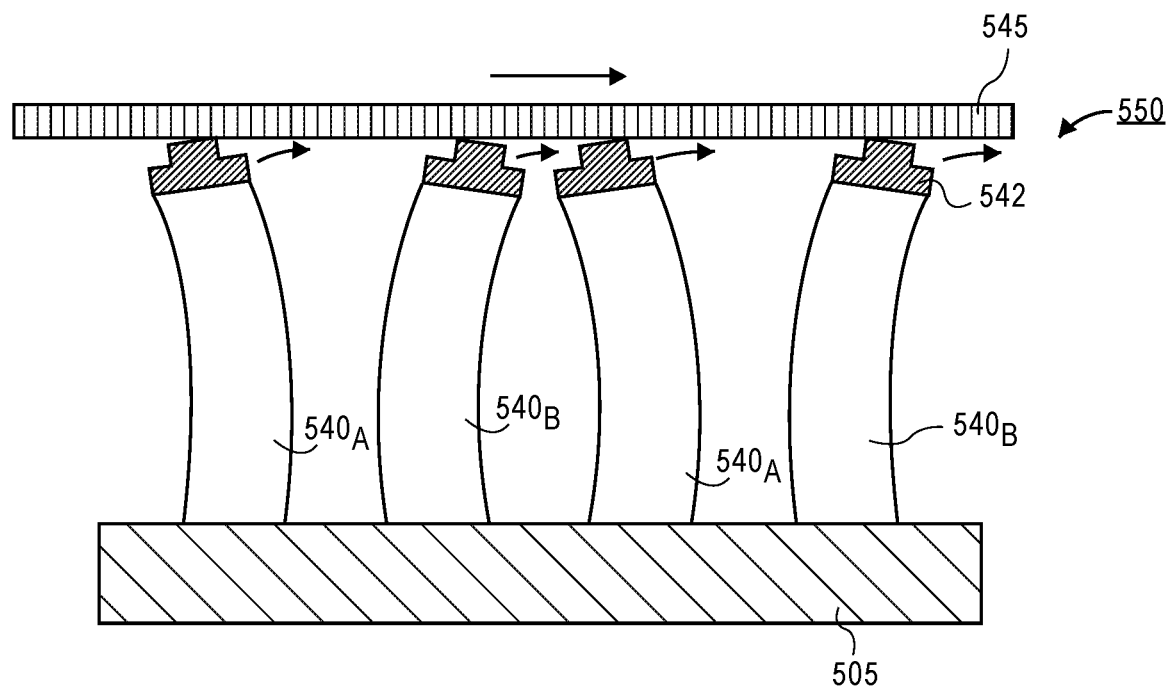
FIG. 5A is a schematic illustration of a portion of a self-propelled system that includes a piezoelectrically driven motor that provides motion with a direct drive process that is in a first position, according to an embodiment of the invention.

Referring now to FIG. 5A, a piezoelectric motor 550 with a plurality of cantilevers 540 extending from a substrate 505 is shown. In FIGS. 5A-5D, the cantilevers 540 are illustrated as a monolithic material, however, embodiments may include the cantilevers 540 that are formed with multiple layers of different materials, such as the substrate material, piezoelectric layers, electrodes, or the like. A more detailed example of the composition and arrangement of the material layers in each cantilever 540 is provided below in the description of FIGS. 6A-6D.

In an embodiment, each cantilever 540 may also include a friction enhancing end 542. The friction enhancing ends 542 may increase the friction between the cantilevers 540 and a surface 545. In an embodiment, the friction enhancing ends 542 may include protrusions to focus the pressure onto a smaller surface area. Alternatively, the friction enhancing ends 542 may have substantially the same shape as the cantilevers 540. For example, the friction enhancing ends 542 may be a surface coating applied over the cantilevers 540. In the illustrated embodiment, the surface 545 is free to move, and the motor 550 is stationary. However, it should be noted that embodiments also may include a stationary surface (e.g., a floor, wall, etc.) and the motor 550 would move instead of the surface 545.

According to an embodiment, the cantilevers 540 may be grouped into first cantilevers $540_A$ and second cantilevers $540_B$. The first cantilevers $540_A$ may be formed in an alternating pattern with the second cantilevers $540_B$. In the illustrated embodiment, there are only two sets of first cantilevers $540_A$ and second cantilevers $540_B$, however embodiments are not limited to such configurations and any number of pairs of first and second cantilevers 540 may be used. Furthermore, it is to be appreciated that the first cantilevers $540_A$ and the second cantilevers $540_B$ may be substantially similar, with the exception that the first cantilevers $540_A$ are controlled in unison with each other, and the second cantilevers $540_B$ are controlled in unison with each other.

According to an embodiment, the coordinated movement of the first cantilevers $540_A$ and the second cantilevers $540_B$ provide motion. For example, in FIG. 5A, the leading edge of the friction enhancing ends 542 of the first cantilevers $540_A$ are initiating contact with the surface 545 and the friction enhancing ends 542 of the second cantilevers $540_B$ are beginning to cease contact with the surface 542. As noted by the arrows next to each cantilever 540, both the first and second cantilevers are generally moving in a forwards direction, albeit at different angles and with different curvatures along the length of the first and second cantilevers. For example, the first cantilevers $540_A$ are curved slightly away from the direction of motion of the surface 545 (as indicated by the arrow above the surface 545) and the second cantilevers are curved slightly towards the direction of motion of the surface 545.

Figure 5B:
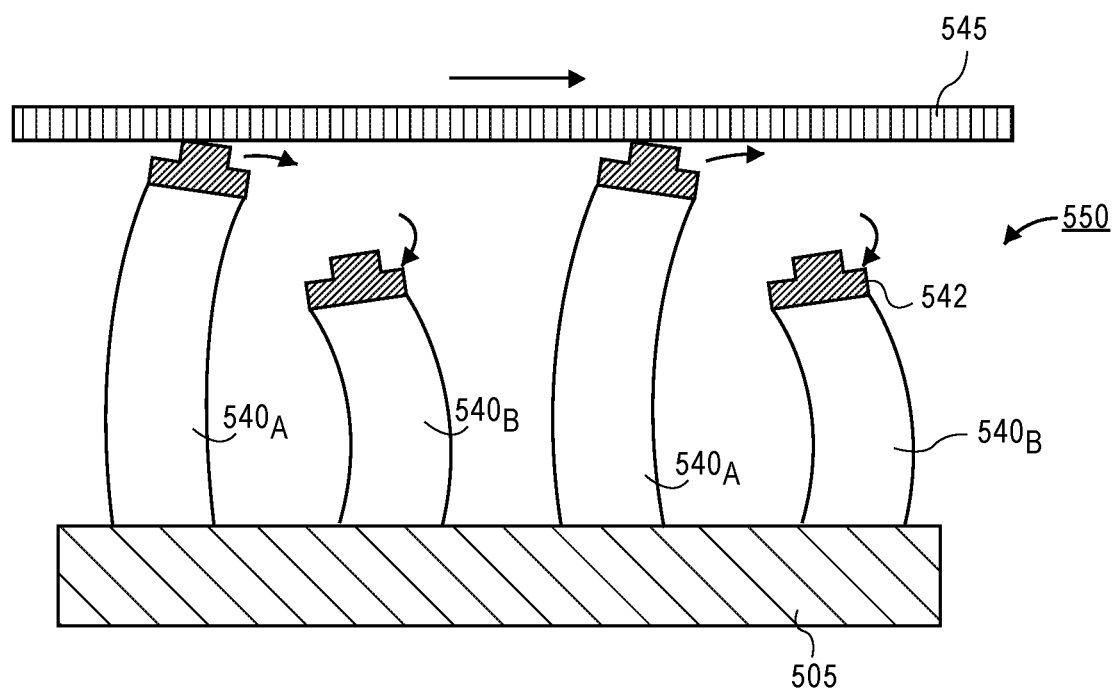
FIG. 5B is a schematic illustration of a portion of the self-propelled system in FIG. 5A in a second position, according to an embodiment of the invention.
Figure 5C:
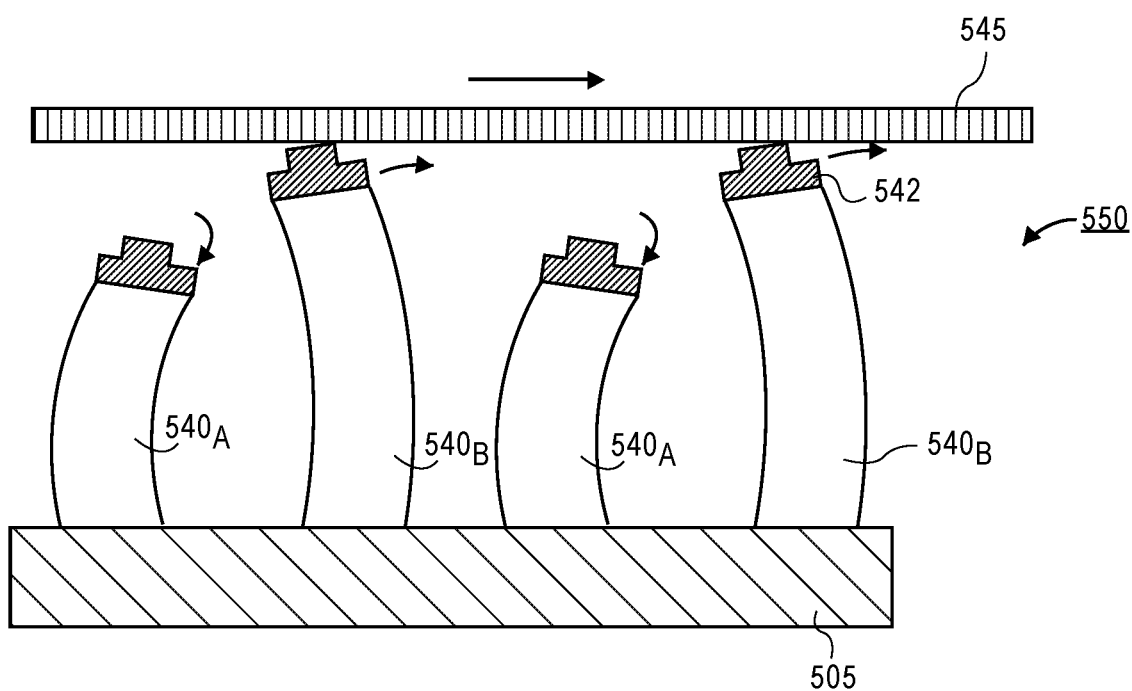
FIG. 5C is a schematic illustration of a portion of the self-propelled system in FIG. 5A in a third position, according to an embodiment of the invention.
Figure 5D:
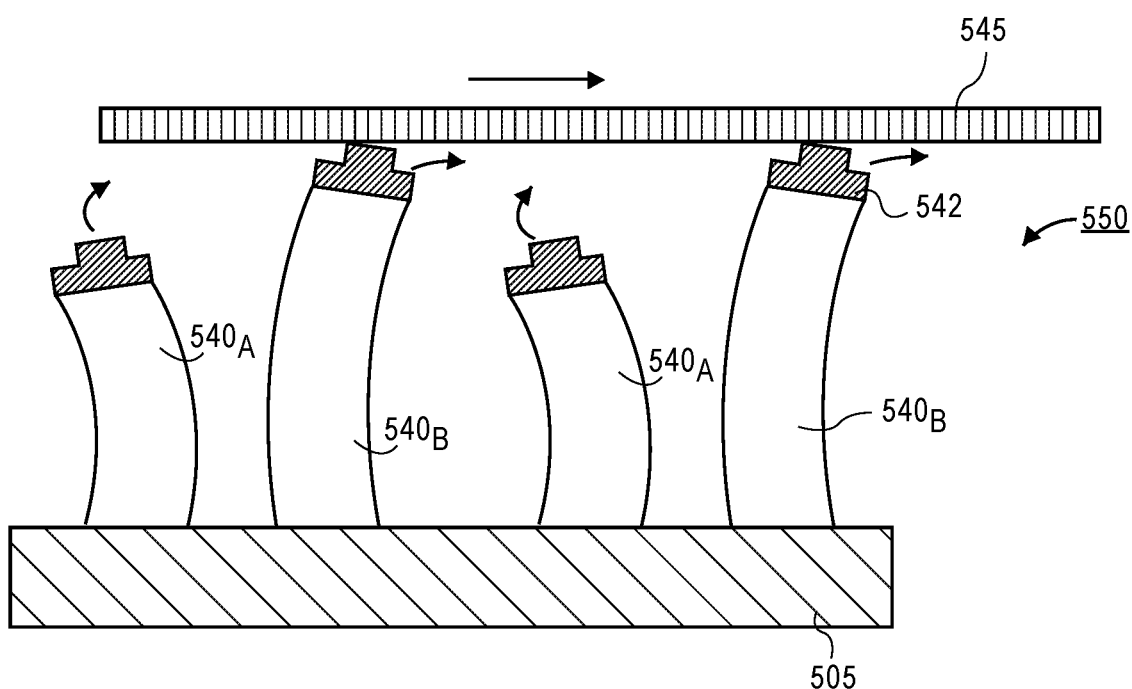
FIG. 5D is a schematic illustration of a portion of the self-propelled system in FIG. 5A in a fourth position, according to an embodiment of the invention.

Referring now to FIG. 5B, the movement of the motor 550 continues with the first cantilevers $540_A$ beginning to curve towards the direction of motion. Additionally, the friction enhancing ends 542 of the first cantilevers $540_A$ are beginning to cease contact with the surface 542. According to an embodiment, the second cantilevers $540_B$ have ceased to contact the surface 545 and curve backward. Next, in FIG. 5C, the movement of the motor 550 continues with the first cantilevers $540_A$ contracting away from the surface 545 and curving backward. The second cantilevers $540_B$ are now extended so that they reinitiate contact with the surface. In FIG. 5D, the second cantilevers $540_B$ continue driving the surface 545 and the first cantilevers 540A are beginning to extend back up to the surface 545 to reinitiate contact. This process may be repeated any number of times to provide the desired amount of motion. Additionally, it is to be appreciated that FIGS. 5A-5D are exemplary illustrations, and the particular movements of each cantilever 540 (e.g., the extent of curvature, contraction, extension, etc.) are not limited to the motions depicted. Embodiments of the invention may include any coordinated movement between the cantilevers 540 that produce motion relative to a surface 545.

Figure 6A:
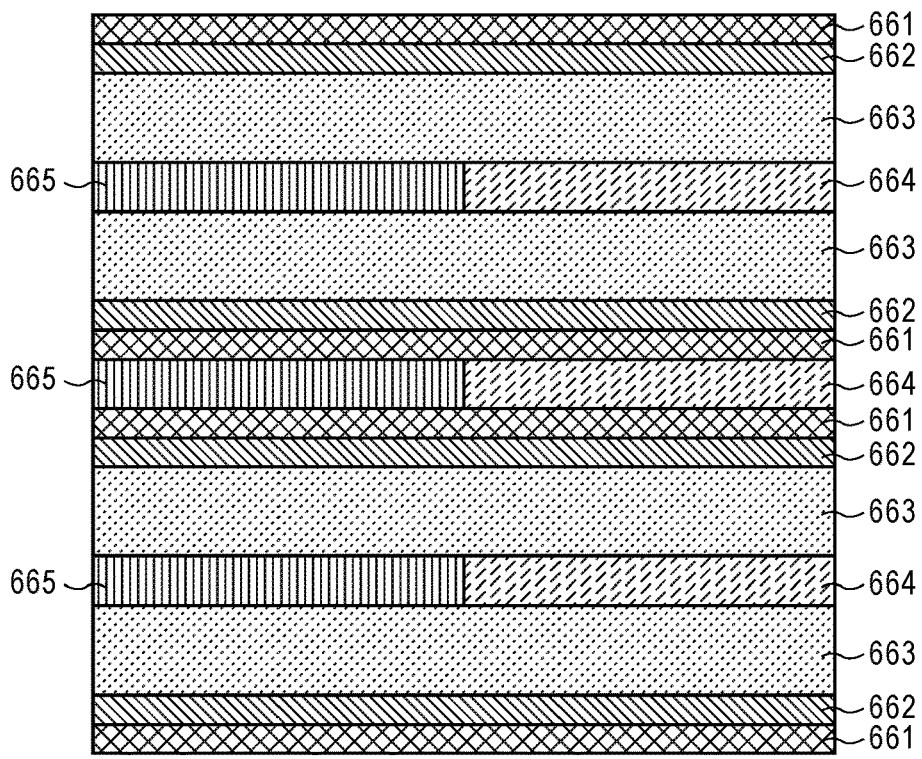
FIG. 6A is a cross-sectional illustration of a portion of a microelectronic package that includes a plurality of layers that may be used to form piezoelectrically driven cantilevers that may be used to provide direct drive motion, according to an embodiment of the invention.

Referring now to FIGS. 6A-6D, cross-sectional illustrations of a multi-layer PCB buildup that may be used to fabricate cantilevers that may be used to provide movement as described above with respect to FIGS. 5A-5D are shown, according to an embodiment of the invention. Referring now to FIG. 6A, a cross-sectional illustration of a portion of a multi-layer PCB buildup is shown, according to an embodiment of the invention. In an embodiment, the buildup may include a plurality of alternating layers that are formed (e.g., by lamination, deposition, plating, or with any other suitable process). Each of the repeating sections may be used to form a portion of an individual cantilever. In the illustrated embodiment, each repeating section includes an electrode layer 661, a piezoelectric layer 662, and a dielectric layer 663. In an embodiment, the piezoelectric layer 662 may be a high performance piezoelectric material that is formed with a deposition and laser annealing process, such as the one described above.

Figure 6B:
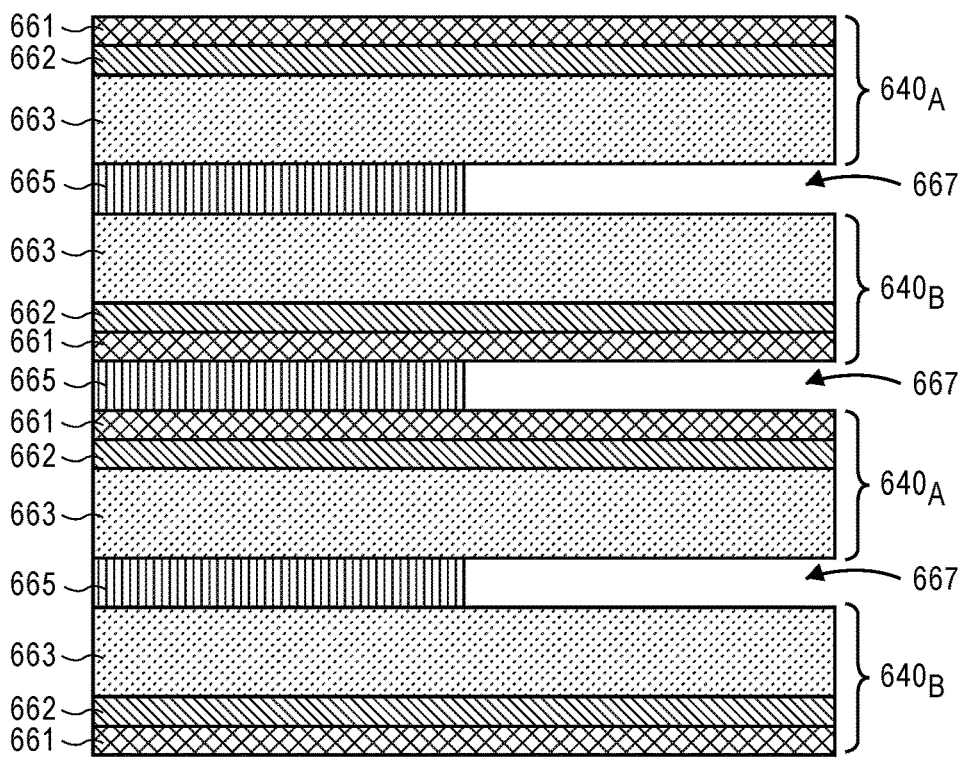
FIG. 6B is a cross-sectional illustration of the portion of a microelectronic package illustrated in FIG. 6A after a temporary adhesive layer is removed to isolate each of the cantilevers, according to an embodiment of the invention.

According to an embodiment, each of the repeating sections may be separated from each other by an adhesive layer. In some embodiments, the adhesive layer may include a permanent adhesive 665 and a temporary adhesive 664. The temporary adhesive 664 may be formed proximate to the edge of the package. Accordingly, when the temporary adhesive is removed, as shown in FIG. 6B, gaps 667 are formed between adjacent cantilevers 640 that are now protruding beyond the edge of the permanent adhesive 665. Embodiments may include removing the temporary adhesive 664 by applying heat to vaporize the temporary adhesive. In some embodiments the temporary adhesive 665 may be omitted (e.g., the temporary adhesive 664 is replaced with a permanent adhesive 665 or both the temporary adhesive 664 and the permanent adhesive 665 are replaced with a dielectric layer), and the gaps 667 may be formed with a material removal process (e.g., routing, patterning, laser milling, etc.).

Figure 6C:
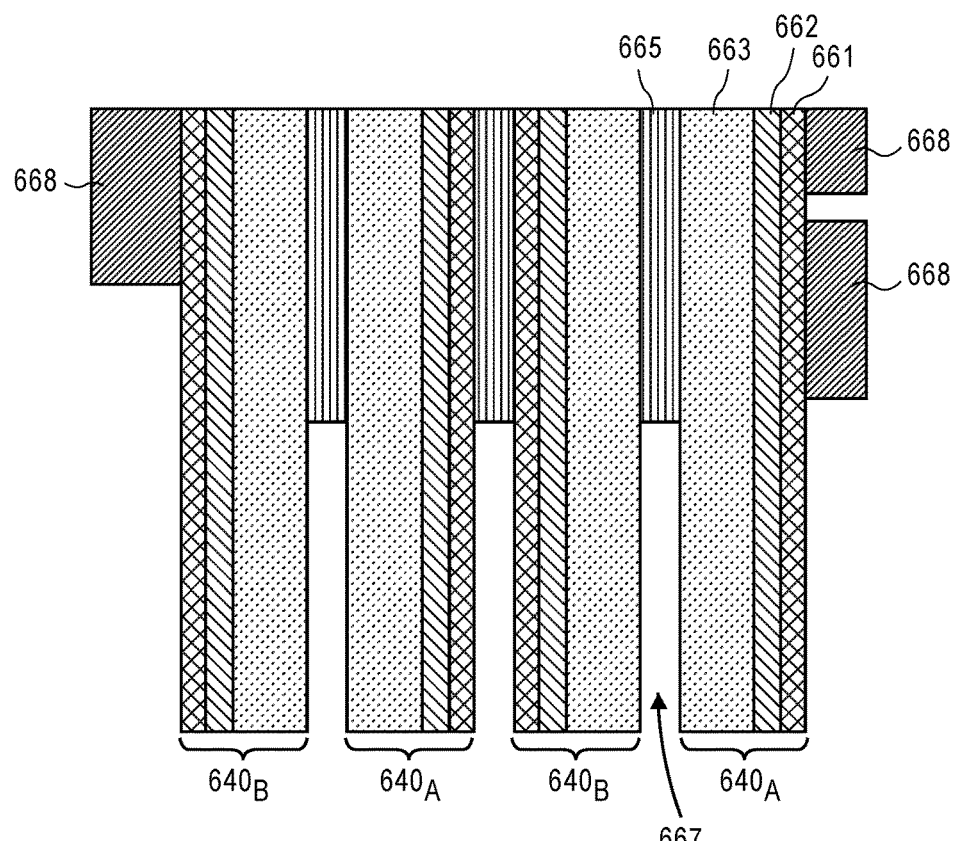
FIG. 6C is a cross-sectional illustration of the portion of a microelectronic package illustrated in FIG. 6B after additional electrical components are mounted to the system and the system is rotated so that the cantilevers are able to contact a surface, according to an embodiment of the invention.

Referring now to FIG. 6C, a cross-sectional illustration of a portion of the system is shown after it has been rotated so that the cantilevers 640 are pointed down so that they can contact a surface (not shown). Additionally, components 668 (e.g., integrated circuitry, memory, communications modules, etc.) may be mounted to either side of the package to provide control of the cantilevers 640. Electrical connections between the components 668 and the cantilevers 640 are omitted for simplicity.

Figure 6D:
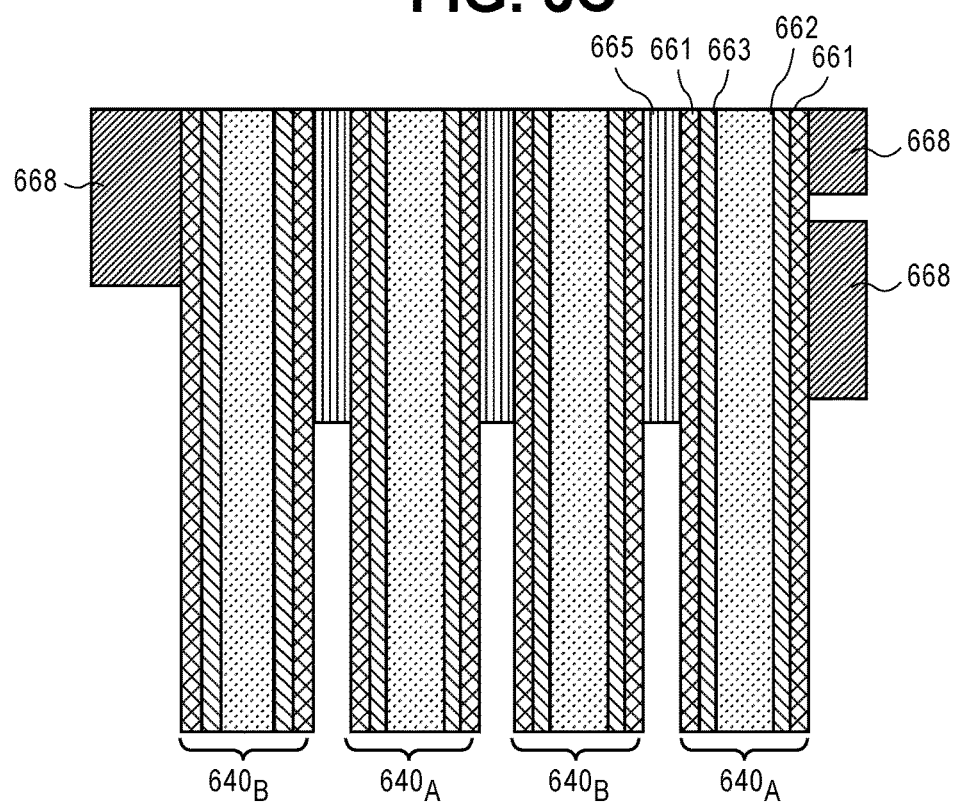
FIG. 6D is a cross-sectional illustration of the portion of a microelectronic package similar to the package in FIG. 6C with additional piezoelectric layers formed over each cantilever, according to an embodiment of the invention.

Referring now to FIG. 6D, a cross-sectional illustration of a system with cantilevers 640 is shown according to an additional embodiment of the invention. The system shown in FIG. 6D is substantially similar to the one illustrated in FIG. 6C, with the exception that a piezoelectric layer 662 and an electrode 661 are formed on each side of the cantilever 640. Such an embodiment may allow for an increased range of motion for each cantilever.

Furthermore, while the illustrated embodiment is described with respect to a PCB buildup structure, embodiments are not limited to such materials and processes. For example, coreless packages, packages with cores, flexible substrate packages, or any other materials may be used to fabricate cantilever based motors. Additionally, while a planar embodiment is shown with the cantilevers 640 extending out from a single edge of the system, embodiments of the invention may also include cantilevers formed in a circular pattern around the system. Such an embodiment may be particularly useful for forming a moveable system that is adapted to moving through the interior of pipes.

Additional embodiments of the invention may also utilize a motor that includes a diaphragm that is coupled to a piezoelectric layer in order to induce motion. Such an embodiment is illustrated with respect to FIGS. 7A and 7B. As illustrated in FIG. 7A, the motor 750 may include a piezoelectric layer 790 may be formed over a substrate layer 705. According to an embodiment, the piezoelectric layer 790 may be a high performance piezoelectric material that is formed with a deposition and laser annealing process, such as the one described above. A diaphragm 792 may be formed over the piezoelectric layer 790. For example, the diaphragm 792 may be formed by depositing a sacrificial material (not shown) over the piezoelectric layer 790 and then depositing the diaphragm 792 over the sacrificial material. The sacrificial material may then be removed to form a void 793 between the diaphragm 792 and the piezoelectric layer. In order to induce rotational motion, a rotor 795 and fin 794 may be coupled to the top surface of the diaphragm 792.

Referring now to FIG. 7B, the piezoelectric layer 790 is contracted (as indicated by the arrows) by applying a voltage differential across the piezoelectric layer 790. Upon contraction of the piezoelectric layer 790, the diaphragm 792 deforms out of plane in the z-direction a distance D. The displacement of the diaphragm 792 causes the fin 794 to deflect, thereby initiating rotation in the shaft of the rotor 795, as indicated by the arrow.

The different motors described above according to various embodiments of the invention may be integrated as a single motor in a moveable system or a plurality of motors may be used to form an array motors in a moveable system. A plurality of motors may be integrated into different layers of the system, and in different orientations to provide movement in multiple directions. Additional embodiments may include using a plurality of different motor types in order to allow for multiple forms of self-propelling movements. Furthermore, embodiments of the invention may include self-propelled system that may be controlled and coordinated by an IC or communications module on the package. Additionally, a plurality of self-propelled systems may be used to form a sensor mesh that is controlled by a gateway device or by a master sensor device within the sensor mesh.

Figure 8:
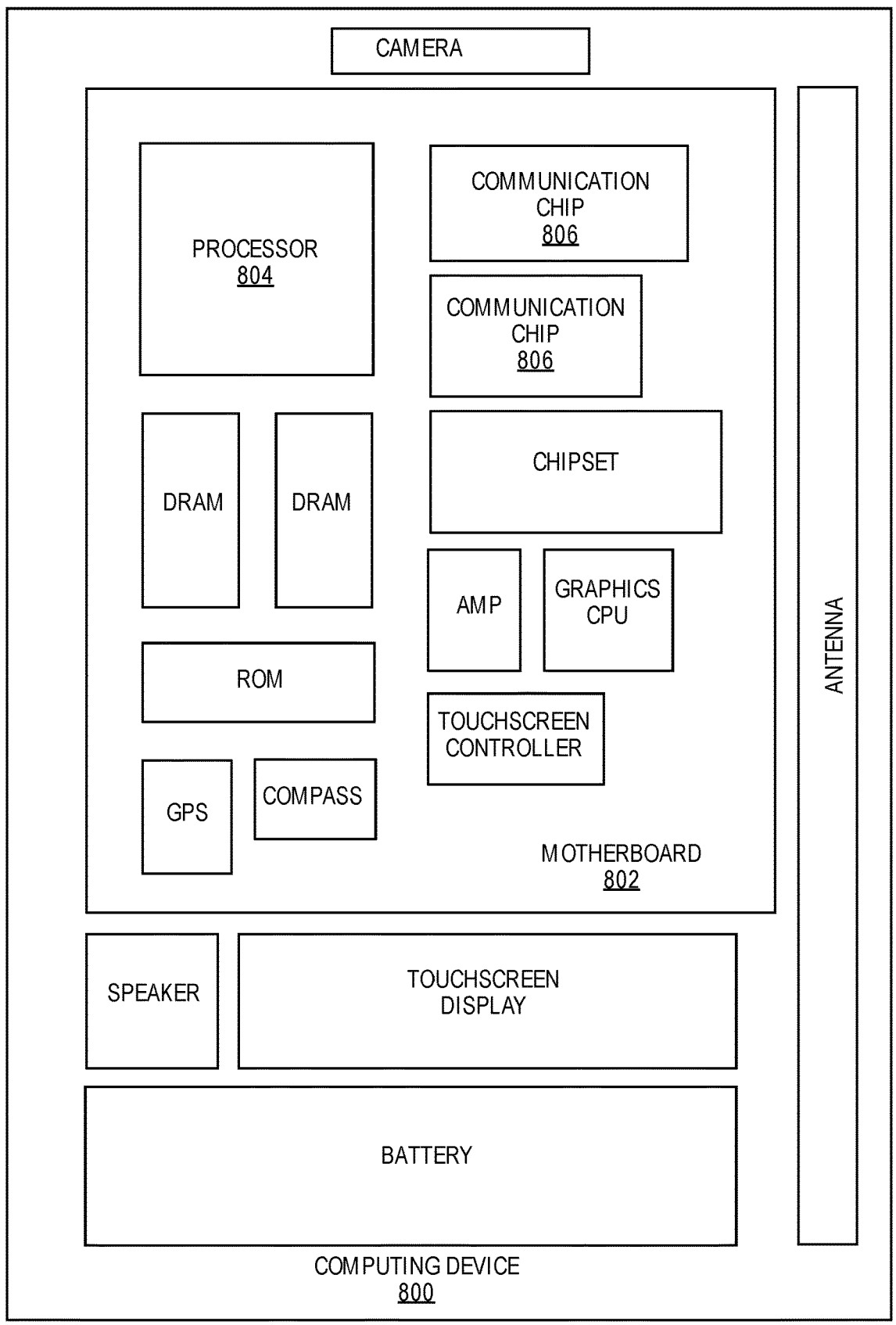
FIG. 8 is a schematic of a computing device built in accordance with an embodiment of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged on an organic substrate and provide signals for actuating one or more piezoelectrically driven motors integrated into or onto the organic substrate, in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged on an organic substrate and provide signals for actuating one or more piezoelectrically driven motors integrated into or onto the organic substrate, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

EXAMPLE 1

A self-propelled system, comprising: a substrate; a piezoelectrically actuated motor integrated with the substrate; a sensor; and an integrated circuit electrically coupled to the piezoelectrically actuated motor.

EXAMPLE 2

The self-propelled system of Example 1, wherein the piezoelectrically actuated motor is a stick and slip motor.

EXAMPLE 3

The self-propelled system of Example 2, wherein the stick and slip motor comprises: a piezoelectric drive arm that extends out from a sidewall of the substrate; and a mass coupled to an end of the piezoelectric drive arm that is opposite from an end of the piezoelectric drive arm that is coupled to the sidewall of the substrate.

EXAMPLE 4

The self-propelled system of Example 3, wherein the piezoelectric drive arm is coupled to a sidewall of the substrate located within a cavity in the substrate.

EXAMPLE 5

The self-propelled system of Example 1, Example 2, Example 3, Example 4, wherein the piezoelectrically actuated motor is an inchworm stepping motor.

EXAMPLE 6

The self-propelled system of Example 5, wherein the inchworm stepping motor comprises: a pair of piezoelectric drive arms; a pair of first piezoelectric clamping arms each formed proximate to first ends of one of the piezoelectric drive arms; and a pair of second piezoelectric clamping arms each formed proximate to second ends of one of the piezoelectric drive arms that is opposite to the firsts end of the piezoelectric drive arms.

EXAMPLE 7

The self-propelled system of Example 6, wherein each of the piezoelectric drive arms are coupled to a sidewall of a trench formed into the substrate.

EXAMPLE 8

The self-propelled system of Example 7, wherein each of the piezoelectric drive arms are coupled to the sidewalls of the trench by a spacer.

EXAMPLE 9

The self-propelled system of Example 1, Example 2, Example 3, Example 4, Example 5, Example 6, Example 7, or Example 8, wherein the piezoelectrically actuated motor is a standing acoustic wave motor.

EXAMPLE 10

The self-propelled system of Example 9, wherein the standing acoustic wave motor comprises: a spindle; a piezoelectric ring formed around the spindle; a plurality of fins extending out from the piezoelectric ring; and an outer ring contacting ends of the plurality of fins, wherein the fins are not permanently attached to the outer ring.

EXAMPLE 11

The self-propelled system of Example 10, wherein the spindle is mounted within a cavity formed in the substrate.

EXAMPLE 12

The self-propelled system of Example 1, Example 2, Example 3, Example 4, Example 5, Example 6, Example 7, Example 8, Example 9, Example 10, or Example 11, wherein the piezoelectrically actuated motor comprises: a plurality of cantilevers extending out from a surface of the substrate; a piezoelectric layer formed along a surface of each cantilever; and an electrode formed over each piezoelectric layer.

EXAMPLE 13

The self-propelled system of Example 12, further comprising a second piezoelectric layer formed along a second surface of each cantilever.

EXAMPLE 14

The self-propelled system of Example 1, Example 2, Example 3, Example 4, Example 5, Example 6, Example 7, Example 8, Example 9, Example 10, Example 11, Example 12, or Example 13, wherein the piezoelectrically actuated motor comprises: a piezoelectric layer formed over the substrate; a diaphragm formed over the piezoelectric layer; a rotor formed over the diaphragm; and a fin contacting a top surface of the diaphragm and coupled to the rotor.

EXAMPLE 15

The self-propelled system of Example 14, wherein the diaphragm displaces the fin and induces rotation of a shaft in the rotor upon contraction of the piezoelectric layer.

EXAMPLE 16

The self-propelled system of Example 1, Example 2, Example 3, Example 4, Example 5, Example 6, Example 7, Example 8, Example 9, Example 10, Example 11, Example 12, Example 13, Example 14, or Example 15, wherein the piezoelectrically actuated motor includes a high performance piezoelectric material that is deposited in an amorphous state and annealed with a laser annealing process.

EXAMPLE 17

The self-propelled system of Example 16, wherein the high performance piezoelectric material is lead zirconate titanate (PZT), potassium sodium niobate (KNN), or zinc oxide (ZnO).

EXAMPLE 18

A self-propelled system, comprising: a substrate; a plurality of piezoelectrically actuated motors integrated with the substrate, wherein the piezoelectrically actuated motors include a piezoelectric material including lead zirconate titanate (PZT), potassium sodium niobate (KNN), or zinc oxide (ZnO); a sensor; an integrated circuit electrically coupled to the piezoelectrically actuated motor; and a communication module electrically coupled to the integrated circuit.

EXAMPLE 19

The self-propelled system of Example 18, wherein the plurality of piezoelectrically actuated motors comprises at least two different types of motors.

EXAMPLE 20

The self-propelled system of Example 18 or Example 19 wherein the plurality of piezoelectrically actuated motors provide movement relative to a surface in more than one direction.

EXAMPLE 21

The self-propelled system of Example 18, Example 19, or Example 20, wherein the sensor is a terahertz sensor.

EXAMPLE 22

The self-propelled system of Example 18, Example 19, Example 20, or Example 21 further comprising: one or more surface mounted motors mounted to the substrate.

EXAMPLE 23

A sensor mesh, comprising: a plurality of self-propelled senor systems that are communicatively coupled over a wireless network, wherein each of the self-propelled sensor systems comprise: a substrate; a plurality of piezoelectrically actuated motors integrated with the substrate, wherein the actuated motors include a piezoelectric material including lead zirconate titanate (PZT), potassium sodium niobate (KNN), or zinc oxide (ZnO); a sensor; an integrated circuit electrically coupled to the piezoelectrically actuated motor; and a communication module electrically coupled to the integrated circuit.

EXAMPLE 24

The sensor mesh of Example 23, wherein the plurality of self-propelled sensor systems are controlled by a master sensor device within the plurality of self-propelled sensor systems.

EXAMPLE 25

The sensor mesh of Example 23 or Example 24, wherein the plurality of self-propelled sensor systems are controlled by a gateway device.

What is claimed is:
1. A self-propelled system, comprising:
an organic substrate;
a piezoelectrically actuated motor integrated with the organic substrate, wherein the piezoelectrically actuated motor comprises a crystalline piezoelectric material;
a sensor; and
an integrated circuit electrically coupled to the piezoelectrically actuated motor.
2. The self-propelled system of claim 1, wherein the piezoelectrically actuated motor is a stick and slip motor.
3. The self-propelled system of claim 2, wherein the stick and slip motor comprises:
a piezoelectric drive arm that extends out from a sidewall of the substrate; and
a mass coupled to an end of the piezoelectric drive arm that is opposite from an end of the piezoelectric drive arm that is coupled to the sidewall of the substrate.
4. The self-propelled system of claim 3, wherein the piezoelectric drive arm is coupled to a sidewall of the substrate located within a cavity in the substrate.
5. The self-propelled system of claim 1, wherein the piezoelectrically actuated motor is an inchworm stepping motor.
6. The self-propelled system of claim 5, wherein the inchworm stepping motor comprises:
a pair of piezoelectric drive arms;
a pair of first piezoelectric clamping arms each formed proximate to first ends of one of the piezoelectric drive arms; and
a pair of second piezoelectric clamping arms each formed proximate to second ends of one of the piezoelectric drive arms that is opposite to the firsts end of the piezoelectric drive arms.
7. The self-propelled system of claim 6, wherein each of the piezoelectric drive arms are coupled to a sidewall of a trench formed into the substrate.
8. The self-propelled system of claim 7, wherein each of the piezoelectric drive arms are coupled to the sidewalls of the trench by a spacer.
9. The self-propelled system of claim 1, wherein the piezoelectrically actuated motor is a standing acoustic wave motor.
10. The self-propelled system of claim 9, wherein the standing acoustic wave motor comprises:
a spindle; a piezoelectric ring formed around the spindle;
a plurality of fins extending out from the piezoelectric ring; and
an outer ring contacting ends of the plurality of fins, wherein the fins are not permanently attached to the outer ring.
11. The self-propelled system of claim 10, wherein the spindle is mounted within a cavity formed in the substrate.
12. The self-propelled system of claim 1, wherein the piezoelectrically actuated motor comprises:
a plurality of cantilevers extending out from a surface of the substrate;
a piezoelectric layer formed along a surface of each cantilever; and
an electrode formed over each piezoelectric layer.
13. The self-propelled system of claim 12, further comprising a second piezoelectric layer formed along a second surface of each cantilever.
14. The self-propelled system of claim 1, wherein the piezoelectrically actuated motor comprises:
a piezoelectric layer formed over the substrate;
a diaphragm formed over the piezoelectric layer;
a rotor formed over the diaphragm; and
a fin contacting a top surface of the diaphragm and coupled to the rotor.
15. The self-propelled system of claim 14, wherein the diaphragm displaces the fin and induces rotation of a shaft in the rotor upon contraction of the piezoelectric layer.
16. The self-propelled system of claim 1, wherein the piezoelectrically actuated motor includes a high performance piezoelectric material that is deposited in an amorphous state and annealed with a laser annealing process.
17. The self-propelled system of claim 16, wherein the high performance piezoelectric material is lead zirconate titanate (PZT), potassium sodium niobate (KNN), or zinc oxide (ZnO).
18. A self-propelled system, comprising:
an organic substrate;
a plurality of piezoelectrically actuated motors integrated with the substrate, wherein the piezoelectrically actuated motors include a crystalline piezoelectric material including lead zirconate titanate (PZT), potassium sodium niobate (KNN), or zinc oxide (ZnO);

a sensor;

an integrated circuit electrically coupled to the piezoelectrically actuated motor; and a communication module electrically coupled to the integrated circuit.

19. The self-propelled system of claim 18, wherein the plurality of piezoelectrically actuated motors comprises at least two different types of motors.

20. The self-propelled system of claim 18, wherein the plurality of piezoelectrically actuated motors provide movement relative to a surface in more than one direction.

21. The self-propelled system of claim 18, wherein the sensor is a terahertz sensor.

22. The self-propelled system of claim 18, further comprising:

one or more surface mounted motors mounted to the organic substrate.

23. A sensor mesh, comprising:

a plurality of self-propelled sensor systems that are communicatively coupled over a wireless network, wherein each of the self-propelled sensor systems comprise:

an organic substrate;

a plurality of piezoelectrically actuated motors integrated with the organic substrate, wherein the actuated motors include a crystalline piezoelectric material including lead zirconate titanate (PZT), potassium sodium niobate (KNN), or zinc oxide (ZnO);

a sensor;

an integrated circuit electrically coupled to the piezoelectrically actuated motor; and a communication module electrically coupled to the integrated circuit.

24. The sensor mesh of claim 23, wherein the plurality of self-propelled sensor systems are controlled by a master sensor device within the plurality of self-propelled sensor systems.

25. The sensor mesh of claim 23, wherein the plurality of self-propelled sensor systems are controlled by a gateway device.

* * * * *